United States Patent
Johnson et al.

(10) Patent No.: US 9,640,418 B2
(45) Date of Patent: May 2, 2017

(54) APPARATUS, SYSTEM, AND METHOD FOR HANDLING ALIGNED WAFER PAIRS

(71) Applicant: SUSS MicroTec Lithography GmbH, Garching (DE)

(72) Inventors: Hale Johnson, Jericho, VT (US); Gregory George, Colchester, VT (US)

(73) Assignee: SUSS MicroTec Lithography GmbH, Garching (DE)

( * ) Notice: Subject to any disclaimer, the term of this patent is extended or adjusted under 35 U.S.C. 154(b) by 0 days.

(21) Appl. No.: 15/150,856

(22) Filed: May 10, 2016

(65) Prior Publication Data

US 2016/0336208 A1 Nov. 17, 2016

Related U.S. Application Data

(62) Division of application No. 15/150,689, filed on May 10, 2016.

(60) Provisional application No. 62/161,988, filed on May 15, 2015.

(51) Int. Cl.
| | |
|---|---|
| H01L 21/67 | (2006.01) |
| H01L 21/677 | (2006.01) |
| H01L 21/687 | (2006.01) |
| H01L 21/683 | (2006.01) |
| H01L 23/00 | (2006.01) |

(52) U.S. Cl.
CPC .... *H01L 21/67742* (2013.01); *H01L 21/6719* (2013.01); *H01L 21/67092* (2013.01); *H01L 21/67748* (2013.01); *H01L 21/6838* (2013.01); *H01L 21/68707* (2013.01); *H01L 21/68721* (2013.01); *H01L 21/68742* (2013.01); *H01L 24/75* (2013.01); *H01L 24/83* (2013.01)

(58) Field of Classification Search
None
See application file for complete search history.

(56) References Cited

U.S. PATENT DOCUMENTS

| | | | |
|---|---|---|---|
| 9,061,423 B2 * | 6/2015 | Pergande | B25J 15/0014 |
| 2011/0014774 A1 * | 1/2011 | Johnson | H01L 21/67092 438/455 |
| 2014/0295656 A1 * | 10/2014 | Waterworth | H01L 21/76898 438/585 |
| 2015/0206783 A1 * | 7/2015 | Johnson | H01L 21/67092 279/4.12 |
| 2016/0111318 A1 * | 4/2016 | Ichinose | H01L 21/6838 430/322 |
| 2016/0118362 A1 * | 4/2016 | Han | H01L 24/75 228/6.2 |
| 2016/0126128 A1 * | 5/2016 | Bonora | H01L 21/68707 414/222.02 |

(Continued)

*Primary Examiner* — Asok K Sarkar
(74) *Attorney, Agent, or Firm* — Hayes Soloway PC

(57) ABSTRACT

An industrial-scale apparatus, system, and method for handling precisely aligned and centered semiconductor wafer pairs for wafer-to-wafer aligning and bonding applications includes an end effector having a frame member and a floating carrier connected to the frame member with a gap formed therebetween, wherein the floating carrier has a semi-circular interior perimeter. The centered semiconductor wafer pairs are positionable within a processing system using the end effector under robotic control. The centered semiconductor wafer pairs are bonded together without the presence of the end effector in the bonding device.

20 Claims, 27 Drawing Sheets

(56) References Cited

U.S. PATENT DOCUMENTS

2016/0158939 A1\* 6/2016 Nakada ................ B25J 9/1682
  156/60
2016/0225625 A1\* 8/2016 Wimplinger .......... H01L 21/187

\* cited by examiner

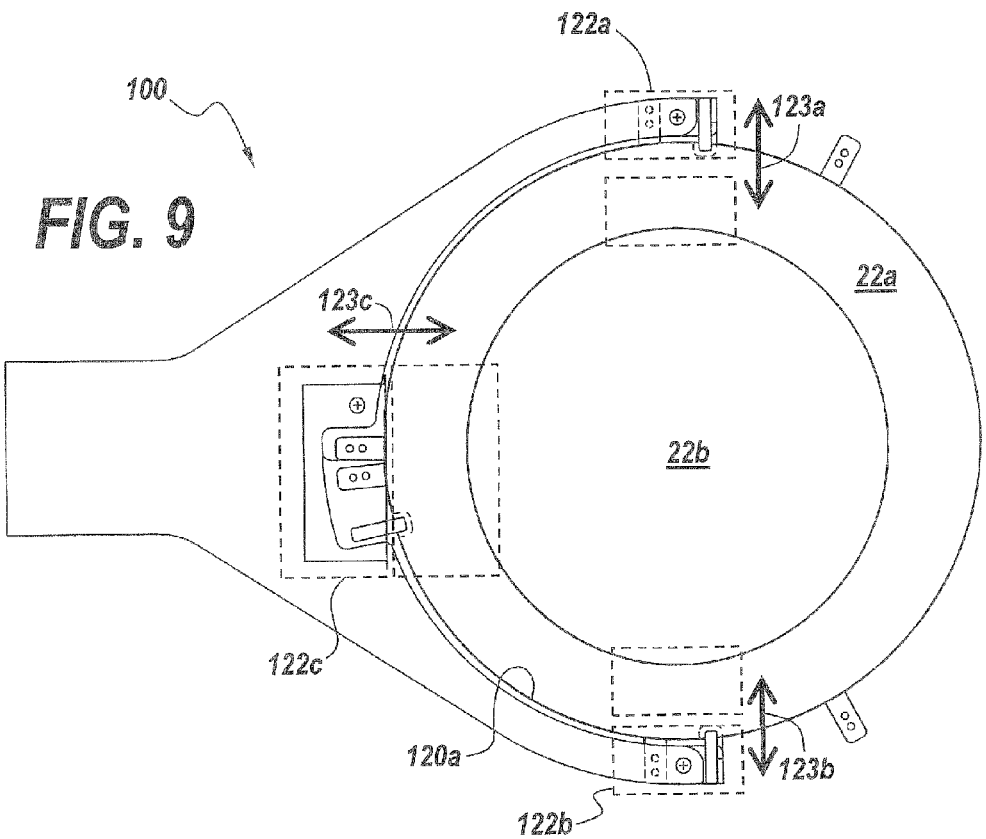
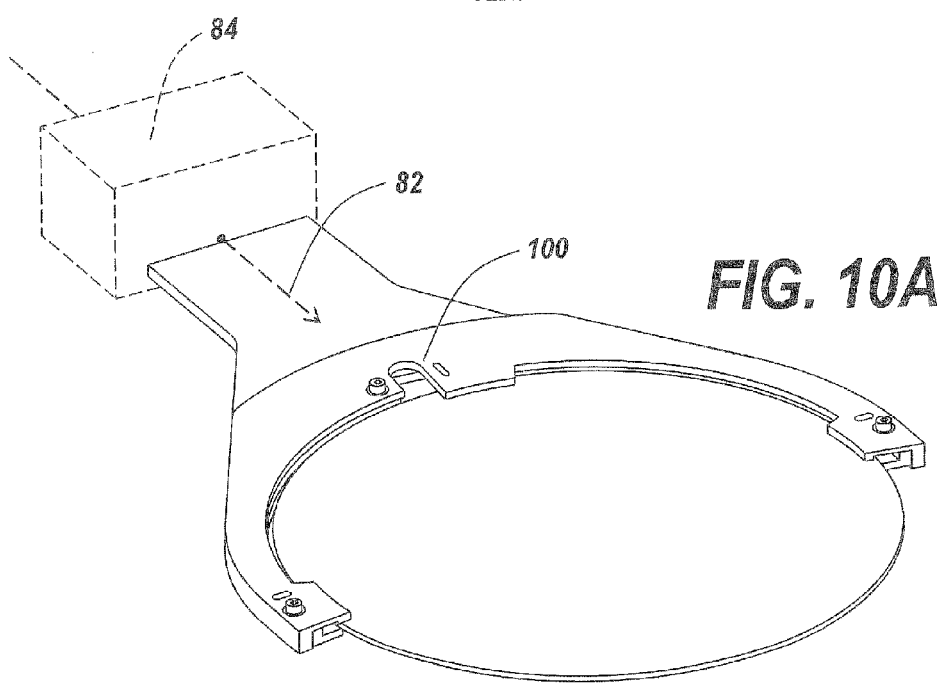

600

```
┌─────────────────────────────────────────────┐
│ Wafers are secured in spaced alignment with an │
│ end-effector having a frame member and a floating │
│ carrier movably connecred to the frame member │
│                    602                      │
└─────────────────────────────────────────────┘
                      │
                      ▼
┌─────────────────────────────────────────────┐
│ A robot is used to move the end-effector, thereby │
│ moving the wafers into a bonding chamber of a bonder │
│                    604                      │
└─────────────────────────────────────────────┘
                      │
                      ▼
┌─────────────────────────────────────────────┐
│  The wafers are unloaded from the end-effector │
│                    606                      │
└─────────────────────────────────────────────┘
                      │
                      ▼
┌─────────────────────────────────────────────┐
│   The end-effector is removed from the bonding │
│                   chamber                   │
│                    608                      │
└─────────────────────────────────────────────┘
                      │
                      ▼
┌─────────────────────────────────────────────┐
│              The wafers are bonded          │
│                    610                      │
└─────────────────────────────────────────────┘
```

*FIG. 19*

APPARATUS, SYSTEM, AND METHOD FOR HANDLING ALIGNED WAFER PAIRS

CROSS REFERENCE TO RELATED APPLICATION

This application claims benefit of U.S. Provisional Application Ser. No. 62/161,988 filed May 15, 2015, entitled, "Apparatus and Method for Handling Aligned Wafer Pairs," and this application is a Divisional Application of U.S. patent application Ser. No. 15/150,689 filed May 10, 2016, the entire disclosures of which are incorporated herein by reference.

FIELD OF THE DISCLOSURE

The present disclosure relates to an apparatus and a method for handling aligned wafer pairs and in particular to an end effector configured to carry aligned semiconductor wafer pairs with a precision suitable for wafer-to-wafer bonding applications.

BACKGROUND OF THE DISCLOSURE

Wafer-to-wafer (W2W) bonding is deployed in a wide range of semiconductor process applications for forming semiconductor devices. Examples of semiconductor process applications where wafer-to-wafer bonding is applied include substrate engineering and fabrication of integrated circuits, packaging and encapsulation of micro-electro-mechanical-systems (MEMS) and stacking of many processed layers (3D-integration) of pure microelectronics. W2W bonding involves aligning the surfaces of two or more wafers, transporting the aligned wafers into a wafer bonding chamber, bringing the wafer surfaces in contact and forming a strong bond interface between them. The overall process yield and manufacturing cost of the so produced semiconductor devices and ultimately the cost of the electronic products that incorporate these devices depend greatly upon the quality of the wafer-to-wafer bond. The quality of the W2W bond depends upon the accuracy of the wafer alignment, the preservation of the wafer alignment during the transport and the bonding process, and the uniformity and integrity of the bond strength across the wafer bond interfaces. Furthermore, extreme care is needed during the transport, positioning, centering and alignment of the wafers in order to avoid fracture, surface damage, or warping of the wafers.

FIG. 1A depicts a schematic diagram of a conventional transport fixture used to transport aligned wafers from an aligner to a bonder, in accordance with the prior art. Traditionally, a wafer pair 18 is aligned in an aligner station 50 and the aligned wafer pair 18 is secured onto a transport fixture 24, as shown in FIG. 1A. The transport fixture 24 carries the aligned wafer pair 18 to the bonding station 60 and to any further processing stations. A prior art transport fixture 24 is described in U.S. Pat. No. 7,948,034 issued on May 24, 2011 and entitled "APPARATUS AND METHOD FOR SEMICONDUCTOR BONDING", the contents of which are expressly incorporated herein by reference.

FIG. 2A depicts the conventional transport fixture of FIG. 1A and as discussed relative to FIG. 3, in accordance with the prior art, and FIG. 2B depicts an enlarged view of the clamping assemblies of the conventional transport fixture of FIG. 2A, in accordance with the prior art. FIG. 3 is a schematic depiction of loading an aligned wafer pair into a bonding chamber using a conventional transport fixture, in accordance with the prior art. Referring first to FIG. 3, a conventional transport fixture 24 is sized to hold an aligned wafer pair (not shown) and a transport device 16 is used to move the transport fixture 24 and the aligned wafer pair into and out of the bonding chamber 12. In one example, transport device 16 is a transport arm or slide that is automated or otherwise manually operated.

As shown in FIG. 2A, transport fixture 24 is a circular shaped ring 280, often constructed from titanium, and includes three noses 280a, 280b, 280c that are symmetrically spaced about the circular shaped ring 280 that act as support points for a base wafer. Proximate to each of the three noses 280a, 280b, 280c are three spacer and clamp assemblies 282a, 282b, 282c arranged symmetrically at the periphery of the circular ring at 120 degrees apart. Each spacer and clamp assembly 282a, 282b, 282c includes a spacer 284 and a clamp 286. Spacer 284 is configured to set two wafers at a predetermined distance. Spacers with different thicknesses may be selected for setting different spacings between the two wafers. Once the spacers are inserted between the wafers, the clamp 286 is clamped down to lock the position of the two wafers. The clamp 286 may be a single structure or a linkage that moves downward to contact an upper wafer to retain it in position on the transport fixture 24. Each spacer 284 and each clamp 286 are independently activated by linear actuators 283 and 285, respectively.

For the bonding process, two aligned wafers are placed in the carrier fixture 24 and are spaced apart with spacers 284 and then clamped down with clamps 286. The fixture with the clamped wafers is inserted in the bonding chamber 12 and then each clamp 286 is unclamped one at a time, and the spacers 284 are removed. Once all spacers 284 are removed and the two wafers are staked together with a pneumatically controlled center pin. Then, a force column is applied to facilitate the bonding process in the bonding device 12 throughout the high-temperature bonding process.

Within the industry, it is known that the transport fixtures 24 can be heavy and challenging for the transport device 16 or a robot to handle. Further, once they are positioned within the bonding device 12, the transport fixtures 24 remain in the bonding device 12 throughout the duration of the bonding process, thus subjecting the transport fixtures 24 to bonding environments of up to 550° C. temperatures, as well as chamber gasses and/or pressures that may be used within the bonding device 12. In particular, the transport fixture 24 may be positioned for an hour or more in a location only a few millimeters away from an outer circumference of a heated chuck of the bonding device 12, such that the transport fixture 24 gets very hot. These conditions place a significant amount of stress on the transport fixtures 24, and especially on the intricate mechanics of the spacers 284 and clamps 286. As a result, over time, the transport fixtures 24 become unreliable and require significant servicing including sensitive adjustment of the mechanics, which has high costs and takes substantial time.

In other implementations, the aligned wafer pair is bonded temporarily and the temporarily bonded wafer pair is transported into the bonding station and any other processing stations. Temporary bonding of the wafers may be used to minimize alignment shift error during processing. The temporary wafer bonding techniques include bonding the centers or the edges of the wafers with a laser beam, bonding the centers or the edges of the wafers with a temporary tack adhesive and bonding the centers or the edges of the wafers via hybrid fusion. The bonded wafer pair is then transported to the bonding device with a transport fixture or similar, conventional transportation devices. The laser bonding techniques require at least one laser-transparent wafer and the adhesive bonding techniques may contribute to contamination of the wafer surfaces.

Accordingly, in light of the aforementioned deficiencies and inadequacies, it is desirable to provide an industrial-scale device for handling precisely aligned and centered semiconductor wafer pairs for wafer-to-wafer bonding applications with high throughput and the ability to handle all types of wafers without introducing any contaminants.

SUMMARY OF THE DISCLOSURE

Embodiments of the present disclosure provide a system and method for an end effector end effector apparatus for handling wafers. Briefly described, in architecture, one embodiment of the system, among others, can be implemented as follows. The end effector apparatus has a frame member and a floating carrier connected to the frame member with a gap formed therebetween, wherein the floating carrier has a semi-circular interior perimeter. A plurality of vacuum pads are connected to the floating carrier, wherein each of the plurality of vacuum pads extends inward of the semi-circular interior perimeter of the floating carrier.

The present disclosure can also be viewed as providing a system for placing aligned wafer pairs into a processing device. Briefly described, in architecture, one embodiment of the system, among others, can be implemented as follows. An end effector has a frame member and a floating carrier for carrying wafers in spaced alignment, wherein the floating carrier is movably connected to the frame member. A robotic arm is connected to the end effector. A processing device has a processing chamber, wherein the frame member and floating carrier are positioned within the processing chamber, and wherein the floating carrier is decoupled from the frame member.

The present disclosure can also be viewed as providing a system for placing aligned wafer pairs into a processing device. Briefly described, in architecture, one embodiment of the system, among others, can be implemented as follows. An end effector has a frame member and a floating carrier, wherein the floating carrier is movably connected to the frame member, and wherein a plurality of clamp-spacer assemblies are connected to at least one of the frame member and the floating carrier to carry wafers in spaced alignment. A robotic arm is connected to the end effector. A bonding device has a bonding chamber, wherein the frame member and floating carrier are positioned within the bonding chamber before a bonding process and removed from the bonding chamber during the bonding process.

The present disclosure can also be viewed as providing methods of placing aligned wafers into a bonding device. In this regard, one embodiment of such a method, among others, can be broadly summarized by the following steps: securing wafers in spaced alignment with an end effector having a frame member and a floating carrier movably connected to the frame member; using a robot to move the end effector, thereby moving the wafers into a bonding chamber of a bonder; unloading the wafers from the end effector; removing the end effector from the bonding chamber; and bonding the wafers.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 9 depicts a bottom view of the end effector with adjustable vacuum pads for holding wafers of different sizes, in accordance with the first exemplary embodiment of this disclosure;

FIGS. 10A-10B depict the end effector in use with a robotic arm, in accordance with the first exemplary embodiment of this disclosure;

FIG. 19 is a flowchart illustrating a method of placing aligned wafers into a bonding device, in accordance with the first exemplary embodiment of the disclosure.

DETAILED DESCRIPTION OF THE DISCLOSURE

The present disclosure provides an industrial-scale device for handling precisely aligned and centered semiconductor wafer pairs for wafer-to-wafer aligning and bonding applications with high throughput. The device includes an end effector that is attached at the end of a robotic arm. The end effector is configured to hold, move and place an aligned pair of wafers into and out of various processing stations without changing the wafer-to-wafer alignment and without introducing any contaminants.

Figure 1A:
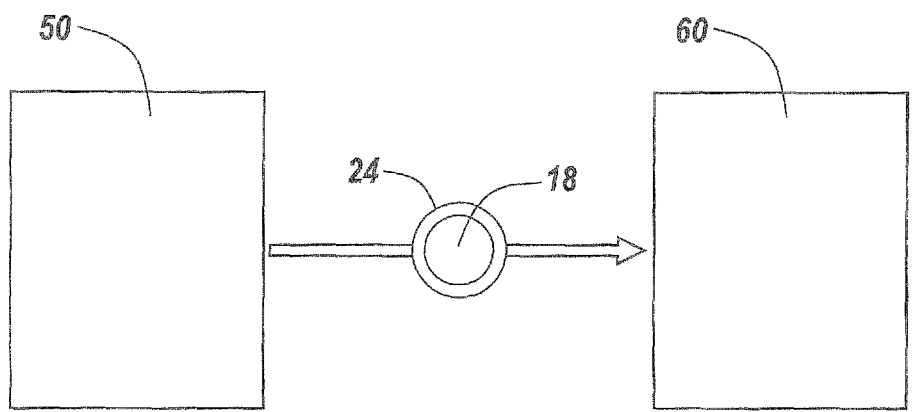
FIG. 1A depicts a schematic diagram of a conventional transport fixture used to transport aligned wafers from an aligner to a bonder, in accordance with the prior art.
Figure 1B:
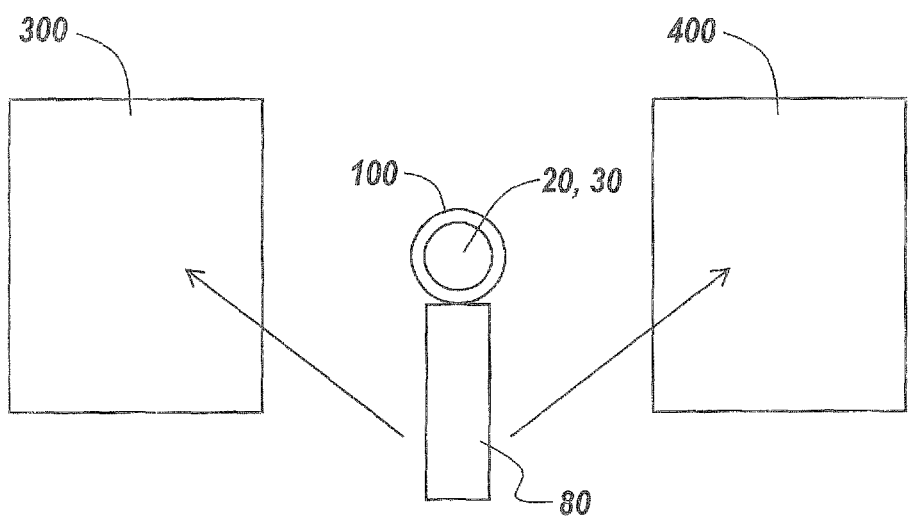
FIG. 1B depicts a schematic diagram of a transport device and method used to transport aligned wafers from an aligner to a bonding device, in accordance with a first exemplary embodiment of this disclosure.

FIG. 1B depicts a schematic diagram of a transport device and method used to transport aligned wafers 20, 30 from an aligner to a bonding device, in accordance with a first exemplary embodiment of this disclosure. As shown in FIG. 1B, an end effector 100 is attached to a robotic arm 80 and is configured to move into and out of an alignment device 300 and a separate bonding station 400 having a bonding device. A pair of two wafers 20, 30 is carried by the end effector 100 into the alignment device 300 where the two wafers 20, 30 are aligned relative to each other and their alignment is secured with the end effector 100. Next, the robotic arm 80 moves the end effector 100 with the aligned wafer pair 20, 30 out of the alignment device 300 and into the bonding station 400, where the two aligned wafers 20, 30 can be bonded. The end effector 100 is capable of placing the two aligned wafers 20, 30 in the bonding device and then the robotic arm 80 removes it from the bonding device for the duration of the bonding process. Once the bonding process is complete, the robotic arm 80 moves the end effector 100 back into the bonding device to collect the bonded wafer pair 20, 30, which are supported by the end-effector 100 as it is removed from the bonding station 400. In some embodiments, the alignment device 300 and the bonding station 400 are integrated into the same reactor.

Figure 4:
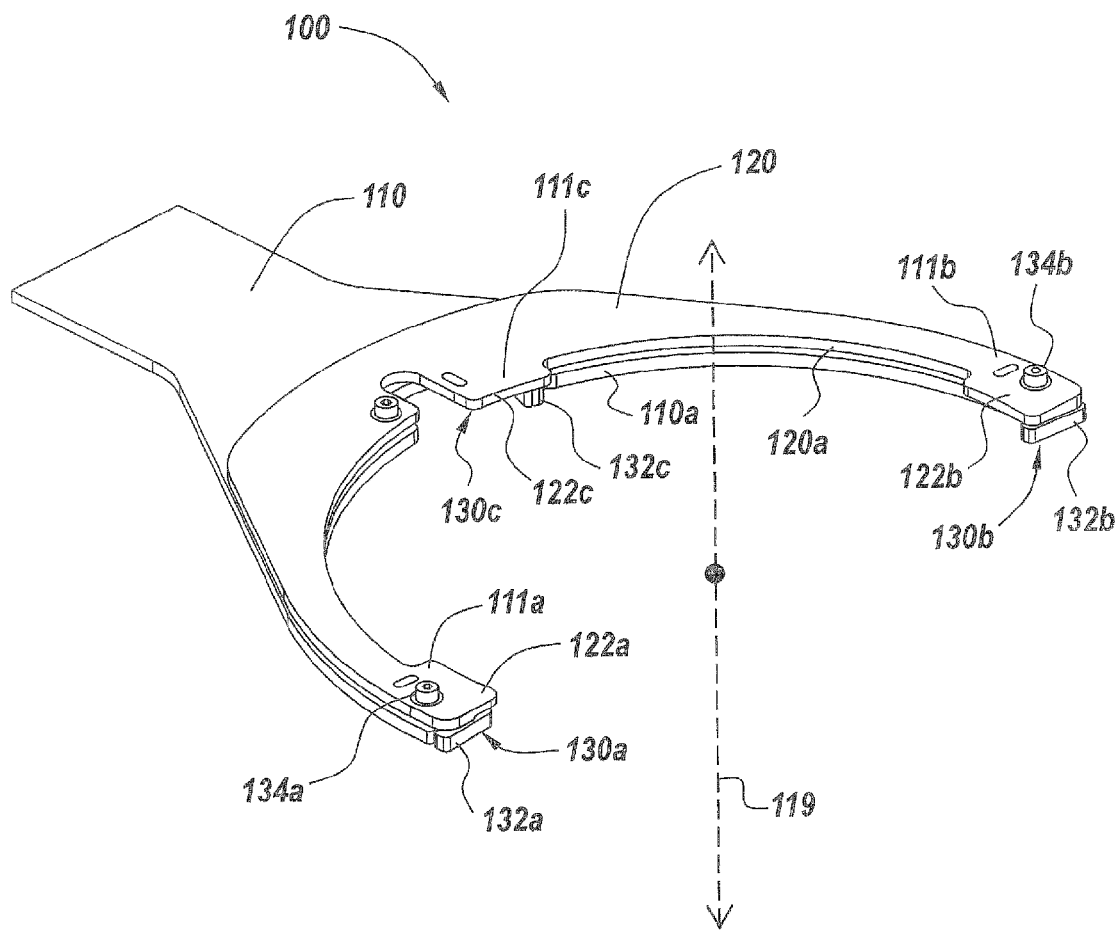
FIG. 4 depicts an end effector used to transport aligned wafers into and out of processing chambers, in accordance with the first exemplary embodiment of this disclosure.

FIG. 4 depicts an end-effector 100 used to transport aligned wafers into and out of processing chambers, in accordance with a first exemplary embodiment of this disclosure. The end effector 100 may include a Y-shaped fixed frame 110 and a floating carrier 120 disposed on top of the frame 110. In one example, frame 110 has a semi-circular inner perimeter 110a with a radius that approximately matches the radius of the wafers 20, 30. In other examples, frame 110 has a Y-shaped or fork-shaped inner perimeter. Similarly, carrier 120 has a semi-circular inner perimeter 120a with a radius that approximately matches the radius of the wafers 20, 30. In accordance with this disclosure, the semi-circular inner perimeter 120a of the floating carrier 120 may be understood as a partial ring structure which has ends that terminate before a complete ring, e.g., 360°, is formed. As shown in FIG. 4, the structure of the semi-circular inner perimeter 120a may be formed from a floating carrier 120 with a partial ring shape that includes substantially 180° of rotation, or in other designs the partial ring shape may be up to 270°. Other partial ring configurations of the floating carrier 120 are also considered within the scope of the present disclosure.

The floating carrier 120 may be formed from a substantially planar structure which is oriented in parallel to a plane of the frame 110 and positioned spaced therefrom. The floating carrier 120 may include a number of vacuum pads, such as three vacuum pads 122a, 122b, 122c, that protrude inward towards a central axis 119 of the semi-circular inner perimeter 120a. The three vacuum pads 122a, 122b, 122c may be positioned at three or more locations 111a, 111b, 111c, of the inner perimeter 120a, respectively. Vacuum pads 122a, 122b and 122c may be used for holding the edges of a top wafer 20, as depicted in FIG. 5.

Figure 2A:
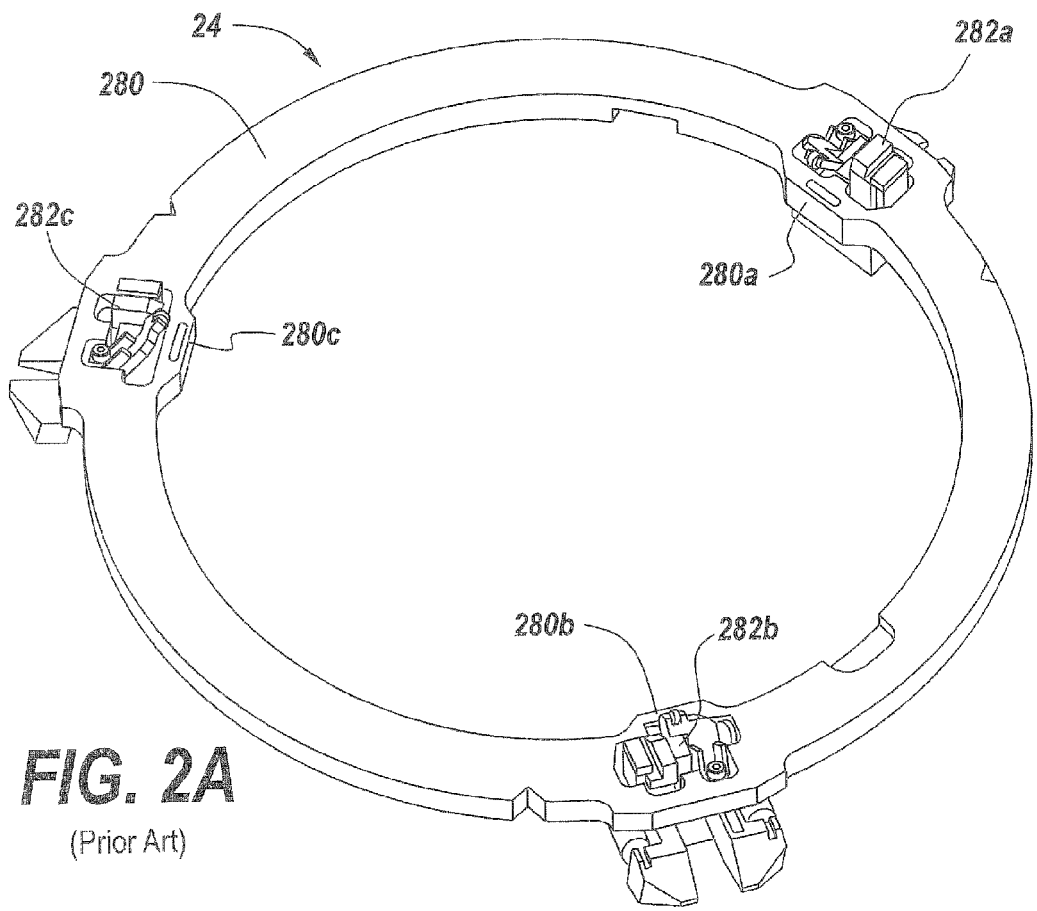
FIG. 2A depicts the conventional transport fixture of FIG. 1A and as shown in FIG. 3, in accordance with the prior art.
Figure 2B:
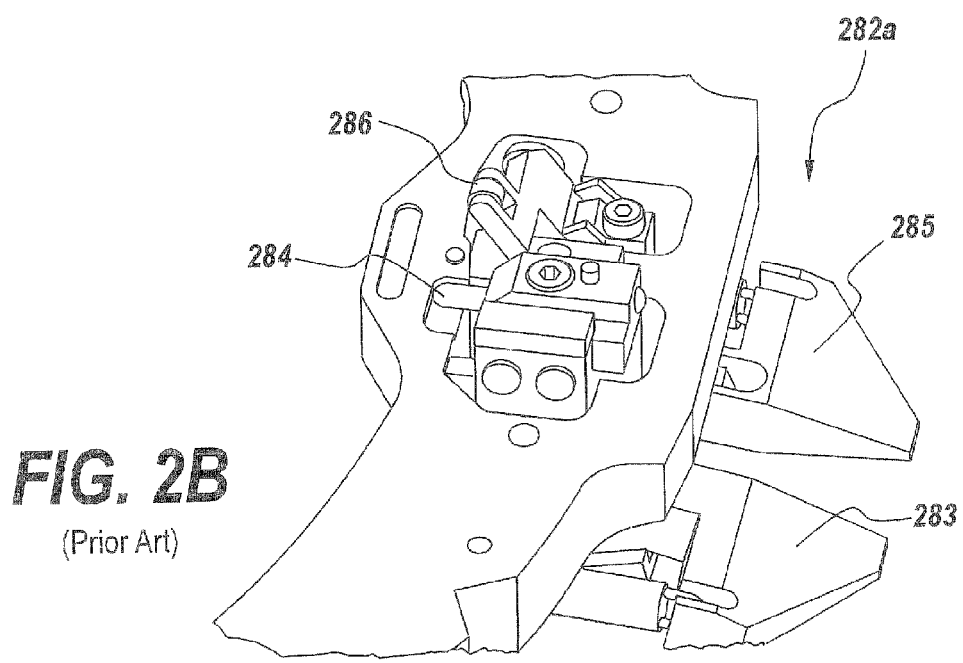
FIG. 2B depicts an enlarged view of the clamping assemblies of the conventional transport fixture of FIG. 2A, in accordance with the prior art.
Figure 3:
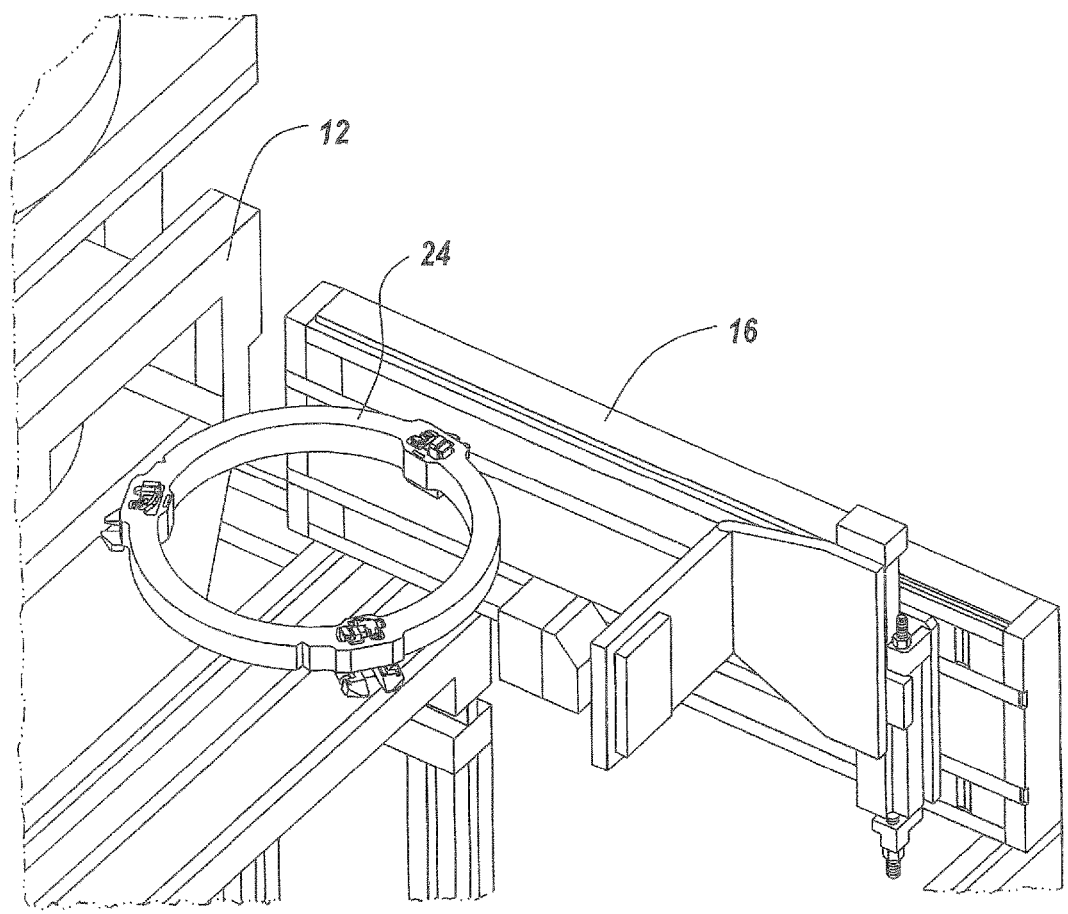
FIG. 3 is a schematic depiction of loading an aligned wafer pair into a bonding chamber using a conventional transport fixture, in accordance with the prior art.
Figure 5:
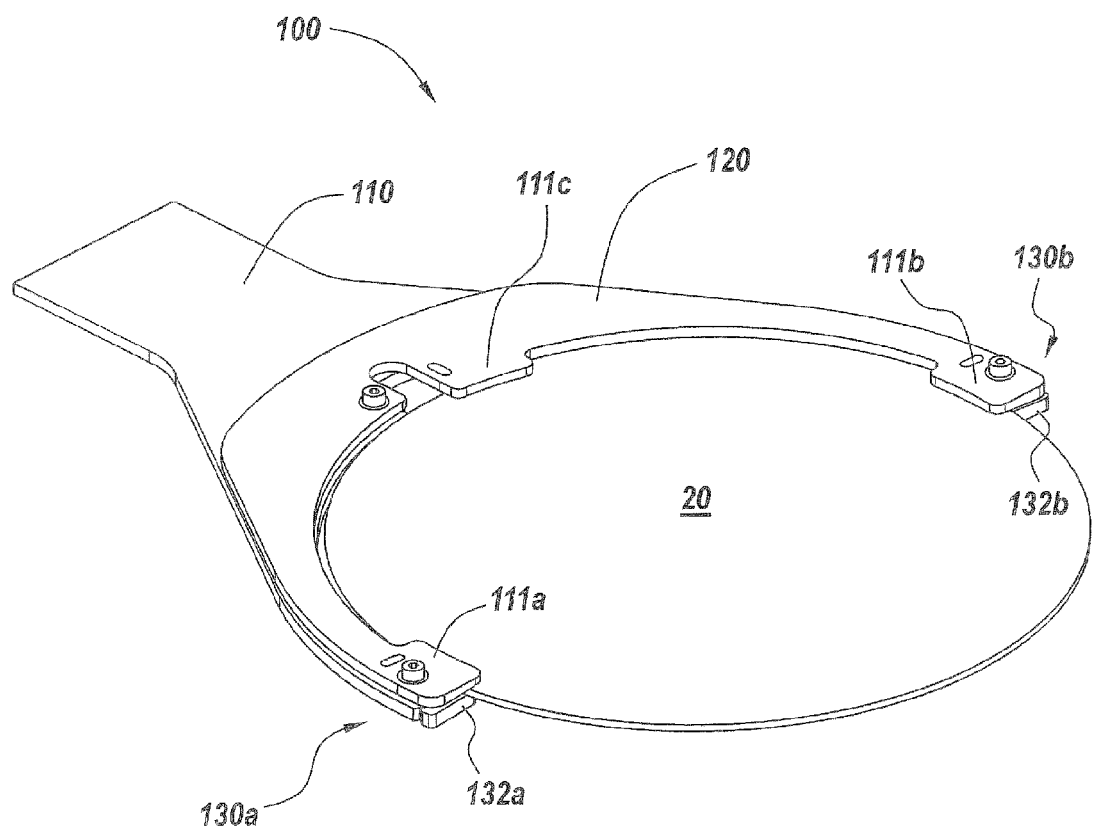
FIG. 5 depicts a top view of the end effector of FIG. 4 holding a pair of aligned wafers, in accordance with the first exemplary embodiment of this disclosure.
Figure 6:
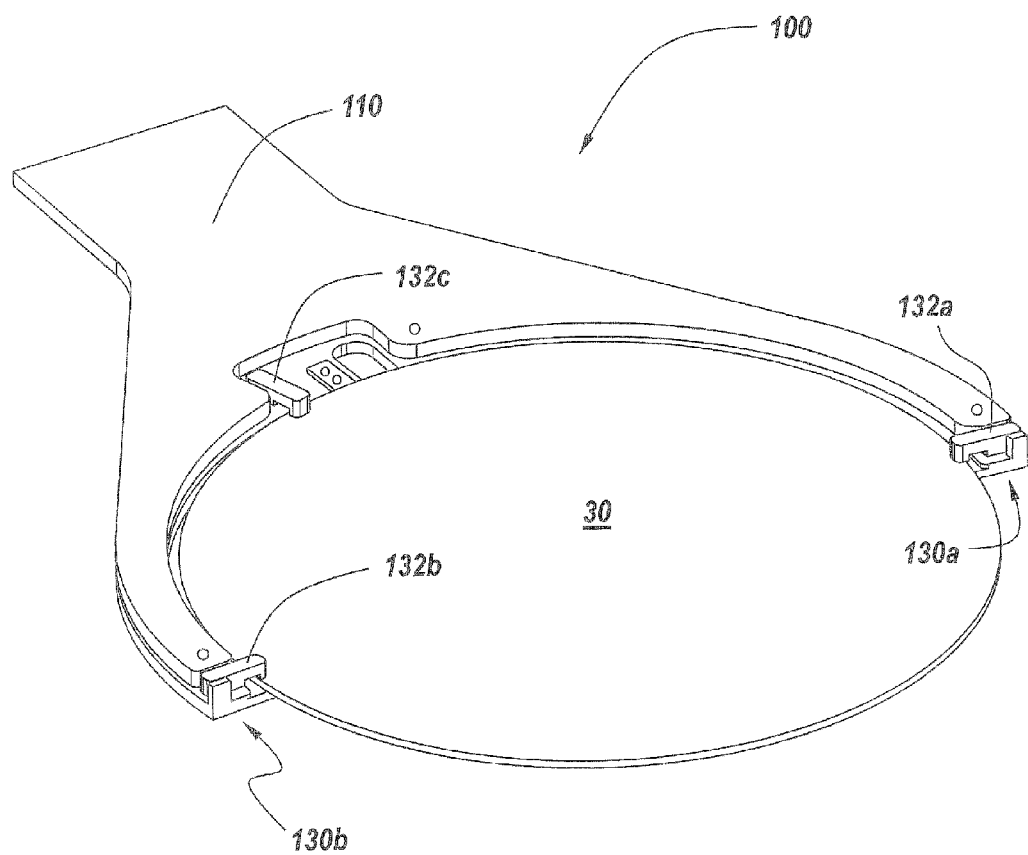
FIG. 6 depicts a bottom view of the end effector of FIG. 4 holding a pair of aligned wafers, in accordance with the first exemplary embodiment of this disclosure.

FIG. 5 depicts a top view of the end effector 100 of FIG. 4 holding a pair of aligned wafers 20, 30, in accordance with the first exemplary embodiment of this disclosure. FIG. 6 depicts a bottom view of the end effector 100 of FIG. 4 holding a pair of aligned wafers 20, 30, in accordance with the first exemplary embodiment of this disclosure. Referring to FIGS. 4-6, it is noted that the end effector 100 may be understood to have the floating carrier 120 positioned on a top side thereof, while the frame member 110 is positioned on a bottom side thereof. Unlike a conventional transport apparatus which carries both of the wafers of the aligned wafer pair on a top surface thereof, e.g., as discussed relative to FIGS. 2A-2C, the end effector 100 may carry the wafers 20, 30 interior of the arms of the frame member 110 and in a position below the extended lip of the floating carrier 120. This design allows the edges of wafers 20, 30 to be held between the fixed frame 110 and the floating carrier 120 in various locations about the inner perimeters 110a, 120a of the frame member 110 and the floating carrier 120, such as in three locations 111a, 111b, 111c via three clamp/spacer assemblies 130a, 130b, and 130c, respectively, as shown in FIG. 5 and FIG. 6. In particular, the top wafer 20, as shown in FIG. 5, may be positioned against and retained by vacuum pads 122a, 122b and 122c on the underside of the floating carrier 120, while the bottom wafer 30 may be retained with mechanical clamps 132a, 132b, and 132c.

Figure 7:
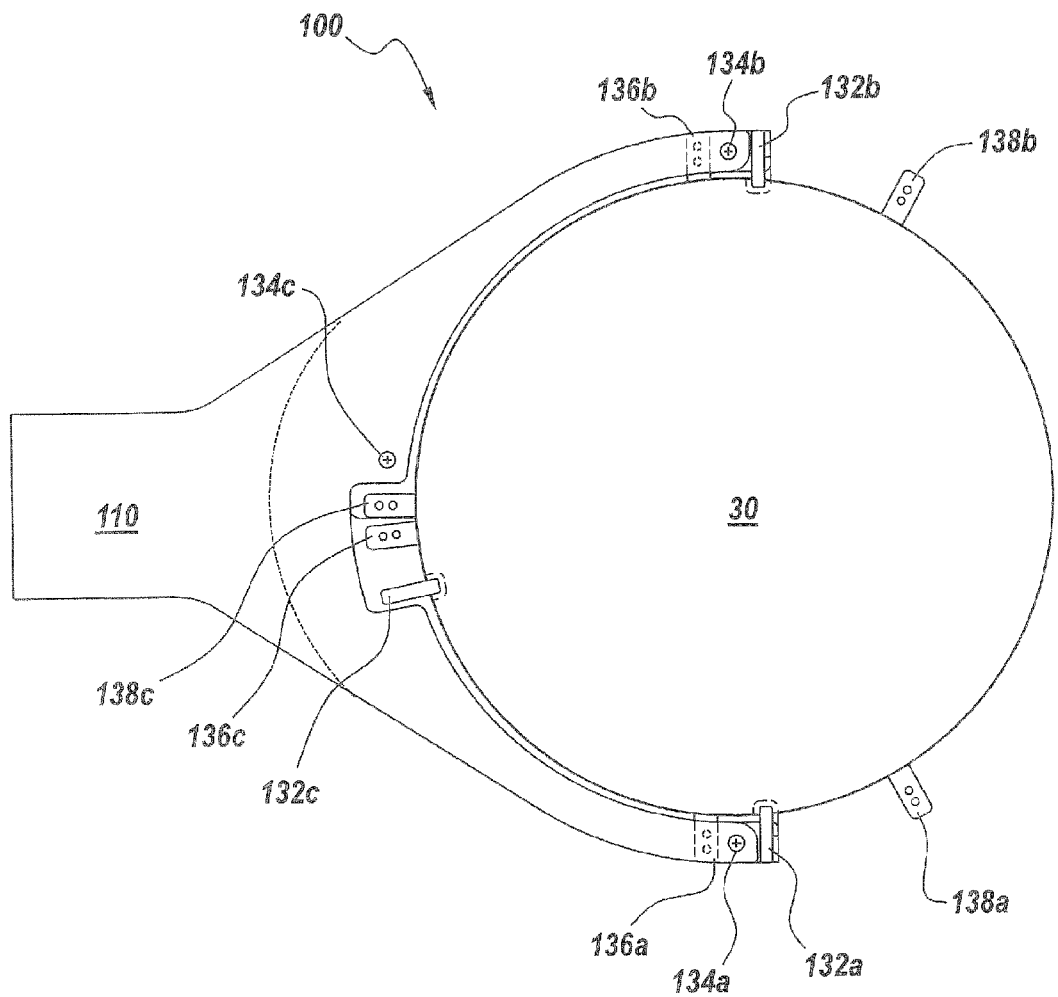
FIG. 7 depicts a partially transparent bottom view of the end effector of FIG. 4 holding a pair of aligned wafers, in accordance with the first exemplary embodiment of this disclosure.
Figure 8A:
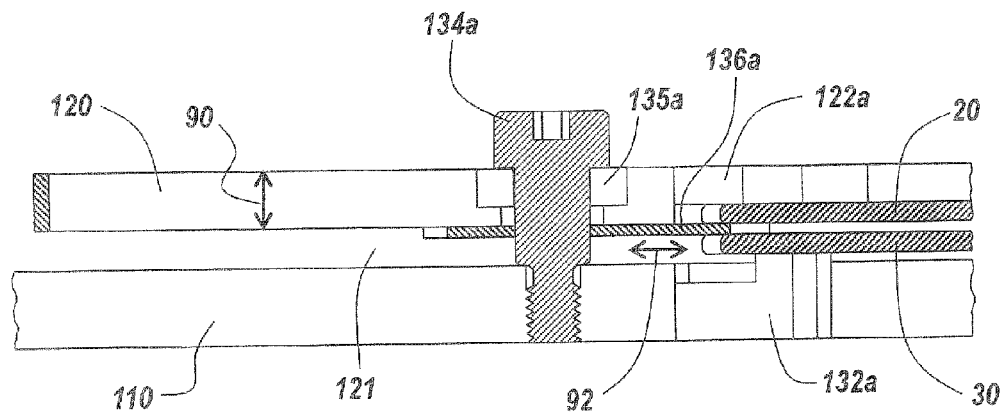
FIG. 8A depicts a cross-sectional view of a portion of the end effector of FIG. 4 holding a pair of aligned wafers, in accordance with the first exemplary embodiment of this disclosure.

FIG. 7 depicts a partially transparent bottom view of the end effector of FIG. 4 holding a pair of aligned wafers, in accordance with the first exemplary embodiment of this disclosure. FIG. 8A depicts a cross-sectional view of a portion of the end effector of FIG. 4 holding a pair of aligned wafers, in accordance with the first exemplary embodiment of this disclosure. With reference to FIGS. 4-8A, the end effector 100 may further include a number of assemblies to hold and/or space the wafers, such as assemblies 130a, 130b, and 130c about the inner perimeter 110a of the frame member 110. The assemblies 130a, 130b, and 130c may be located in a spaced position that substantially matches the spaced positioning of the vacuum pads 122a, 122b and 122c. Each of the assemblies 130a, 130b, and 130c may include a carrier spacer flag 136a, 136b and 136c, a mechanical clamp 132a, 132b, and 132c, and a limit-feature 134a, 134b and 134c, respectively.

Limit-features 134a, 134b, 134c may loosely couple and hold the floating carrier 120 and the fixed frame 110 together. A gap 121 is formed between the floating carrier 120 and each of the limit features 134a, 134b and 134c, as shown in FIG. 8A. Gap 121 contributes to vibrational isolation of the floating carrier 120 from the fixed frame 110, which may prevent vibrations originating in the robot carrying the end-effector 100 from being transmitted to the floating carrier 120 and also allows the floating carrier 120 to seat in a compliant way on the top wafer-to-chuck datum interface, as well as avoiding any harsh or stressful contact. The floating carrier 120 is configured to move up and down along direction 90 of FIG. 8a, relative to the fixed frame 110, loosely guided by limit-features 134a, 134b, and 134c. While the limit-features 134a, 134b, 134c may have varying designs, in one example, a lower portion of the limit-features 134a, 134b, 134c may threadedly connect to the frame member 110 while an upper portion is movable relative to the floating carrier 120. For example, the upper portion of the limit-features 134a, 134b, and 134c may include a head that is locatable within a recessed cavity, e.g., recessed cavity 135a in FIG. 8a, which allows for constrained movement of the floating carrier 120 relative to the frame member 110 in direction 90, thereby allowing control of a maximum size of the gap 121. Additionally, the size of the limit-features 134a, 134b, and 134c relative to the recessed cavity may be selected to provide small amounts of lateral clearance, such that the floating carrier 120 may be slightly adjusted laterally relative to the frame member 110.

Carrier spacer flags 136a, 136b, 136c are used to space the wafers 20, 30 from one another when they are received by the end effector 100. In one example, the carrier spacer flags 136a, 136b, 136b may be constructed from stainless steel body with a titanium nitride coating, but various materials and coatings may also be used. Carrier spacer flags 136a, 136b, 136c may be inserted underneath the edge of wafer 20 in the corresponding three locations 111a, 111b, 111c and then wafer 30 is stacked underneath the spacer flags 136a, 136b, 136c, as shown in FIG. 8A. The two stacked wafers 20, 30 may then be clamped together with clamps 132a, 132b, 132c in the corresponding three locations 111a, 111b, 111c. Spacer flags 136a, 136b, 136c are configured to move horizontally along direction 92 and clamps 132a, 132b, 132c are configured to move in a pivotal motion, along a linear slide, with a cam-type motion, or a combination thereof, to contact the bottom wafer 30. For instance, in one example, the clamps 132a, 132b, 132c may rotate about a pivot axis that is substantially parallel to an axis of the semi-circular interior perimeter 120a.

FIG. 7 also illustrates bonder spacer flags 138a, 138b, 138c, which are the spacer flags used by the bonding device to space the two stacked wafers 20, 30 when they are placed within the bonding device. As can be seen, the bonder spacer flags 138a, 138b, 138c may be positioned in proximate locations to the end effector spacer flags 136a, 136b, 136c, which may be spaced substantially equidistantly about the semi-circular perimeter of the floating carrier 120.

Figure 8B:
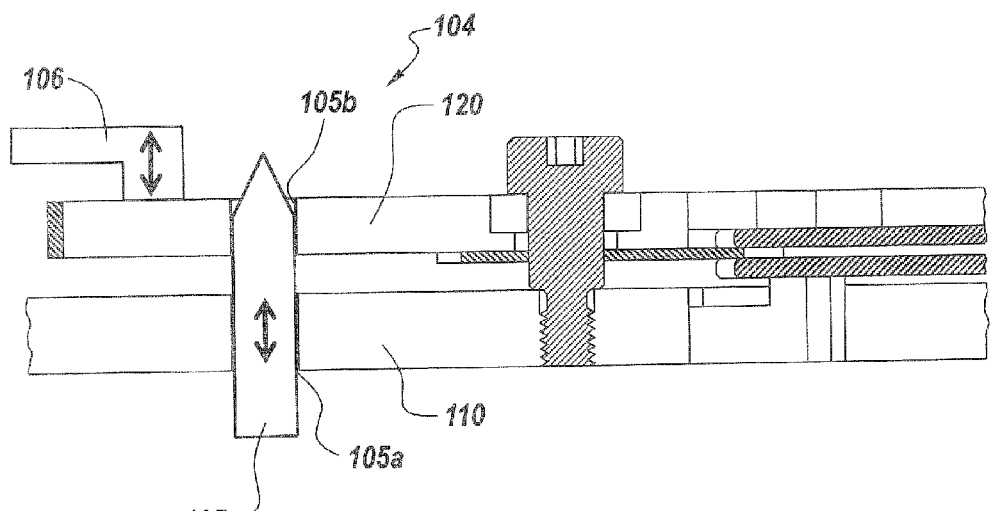
FIG. 8B depicts a cross-sectional view of the end effector of FIG. 4 holding a pair of aligned wafers, in accordance with the first exemplary embodiment of this disclosure.

In some uses, it may be desirable to equip the end effector 100 with a centering and/or locking mechanism to center and/or lock the floating carrier 120 to the frame member 110. FIG. 8B depicts a cross-sectional view of the end effector of FIG. 4 holding a pair of aligned wafers, in accordance with the first exemplary embodiment of this disclosure. Specifically, FIG. 8B illustrates a centering mechanism 104 utilizing a moving tapered pin 105, which allows for re-centering of the floating carrier 120 to the frame member 110 in between each cycle of use. Pin 105 is precision guided and driven by a motor or via pneumatic actuation on an axis at the fixed carrier 110. Pin 105 may be positioned within a first hole 105a in the frame member 110 and engages a precision fitted hole 105b in the floating carrier 120. Pin 105 may be used for the re-centering purpose or may also be used during transport to constrain the floating carrier 120 to the frame member 110. In other designs, the pin 105 may be a fixed pin located on the frame member 110 which engages a precision fitted hole 105b in the floating carrier 120 when the distance between the frame member 110 and the floating carrier 120 is very small, i.e., smaller than the length of the pin 105 itself, and is reset when the floating carrier 120 moves back onto the frame member 110.

FIG. 8B also illustrates the use of a mechanical clamp 106 which may be used to fix the frame member 110 to the floating carrier 120. The mechanical clamp 106 may be mounted to the fixed carrier 110 and may move in a vertical direction or a rotational direction to engage the frame member 110 to the floating carrier to hold the floating carrier 120 to the frame member 110 and to avoid position change of the floating carrier 120.

Figure 8C:
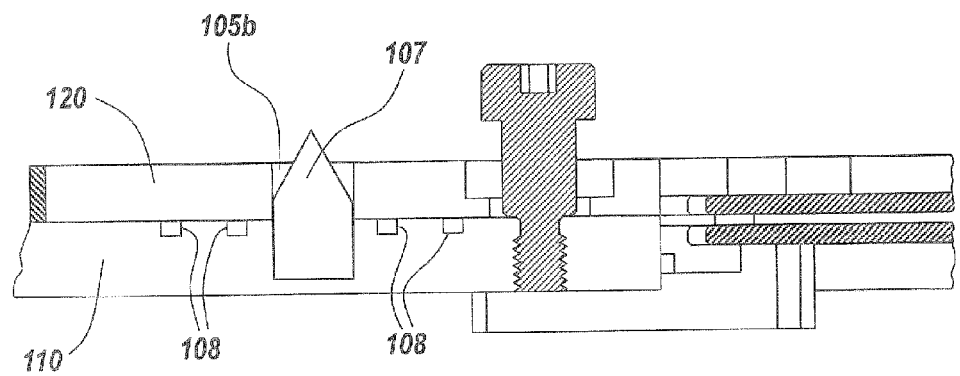
FIG. 8C depicts a cross-sectional view of the end effector of FIG. 4 holding a pair of aligned wafers, in accordance with the first exemplary embodiment of this disclosure.

FIG. 8C depicts a cross-sectional view of the end effector of FIG. 4 holding a pair of aligned wafers, in accordance with the first exemplary embodiment of this disclosure. In FIG. 8C, an integrated fixed re-indexing pin and vacuum groove may be used to for clamping the frame member 110 to the floating carrier 120. As shown, the frame member 110 may have a pin 106 extending into hole 105b the floating carrier 120 and a plurality of vacuum grooves 108 positioned on a surface of the frame member 110 that interfaces with the floating carrier 120. A negative pressure may be applied to the vacuum grooves 108 to bias the floating carrier 120 to the frame member 110 while the pin 106 acts to center the floating carrier 120 to the frame member 110.

Figure 8D:
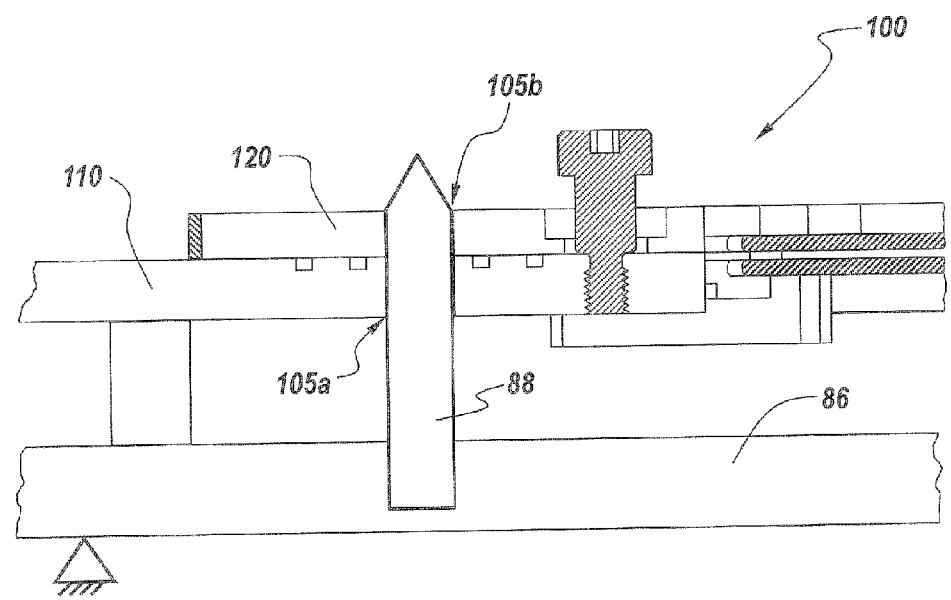
FIG. 8D depicts a cross-sectional view of the end effector of FIG. 4 positioned on a storage station, in accordance with the first exemplary embodiment of this disclosure.

FIG. 8D depicts a cross-sectional view of the end effector of FIG. 4 positioned on a storage station, in accordance with the first exemplary embodiment of this disclosure. As shown, the holes 105a, 105b within the frame member 110 and floating carrier 120 may be used during a handing-off process with the end effector 100, such as to change between different end effectors 100. Specifically, the robotic arm on which the end effector 100 is carried, as is described relative to FIG. 10A, may position the end effector 100 near a storage station 86 which has a pin 88 extending outwards. The end effector 100 may be guided over the pin 88 of the storage station 86 until the pin 88 engages with the holes 105a, 105b. Once the pin 88 is positioned within the holes 105a, 105b, the robotic arm may disconnect from the end effector 100, leaving the end effector 100 in a stowed away position on the storage station 86. The storage station 86 with the pin 88 may provide secure storage of the end effector 100 when it is not in use, as well as allow the robotic arm to quickly change between different end effectors 100.

It is further noted that when the end effector 100 is removed from a bonding device, the high temperature of the end effector 100 may be monitored using an integrated thermocouple positioned on the frame member 110, or on another part of the end effector 100. In another design, the storage station 86 may be equipped with a thermocouple to allow for thermal monitoring of the end effector 100 when it is stowed in the storage station 86. Further, when the end effector 100 is placed in the storage station 86, it may desirable for it to be cooled to a lower temperature, either through natural cooling or with a cooling device.

FIG. 9 depicts a bottom view of the end effector 100 with vacuum pads 122a, 122b and 122c that are adjustable to hold wafers of different sizes, in accordance with the first exemplary embodiment of this disclosure. As shown, the vacuum pads 122a, 122b and 122c may be movably connected to the floating carrier 120 such that they can be radially adjusted along the semi-circular interior perimeter 120a, e.g., along directions 123a, 123b such that they can be moved closer and further towards a center point of the semi-circular interior perimeter 120a. FIG. 9 illustrates broken boxes showing the general outline of the vacuum pads 122a, 122b and 122c in two exemplary positions: one where they are positioned closer towards the center point to hold a smaller wafer size 22b and one where they are positioned further from the center point to hold a larger wafer size 22a. The vacuum pads 122a, 122b and 122c may be adjustable to various degrees to accommodate a plurality of differently sized wafers.

Figure 10B:
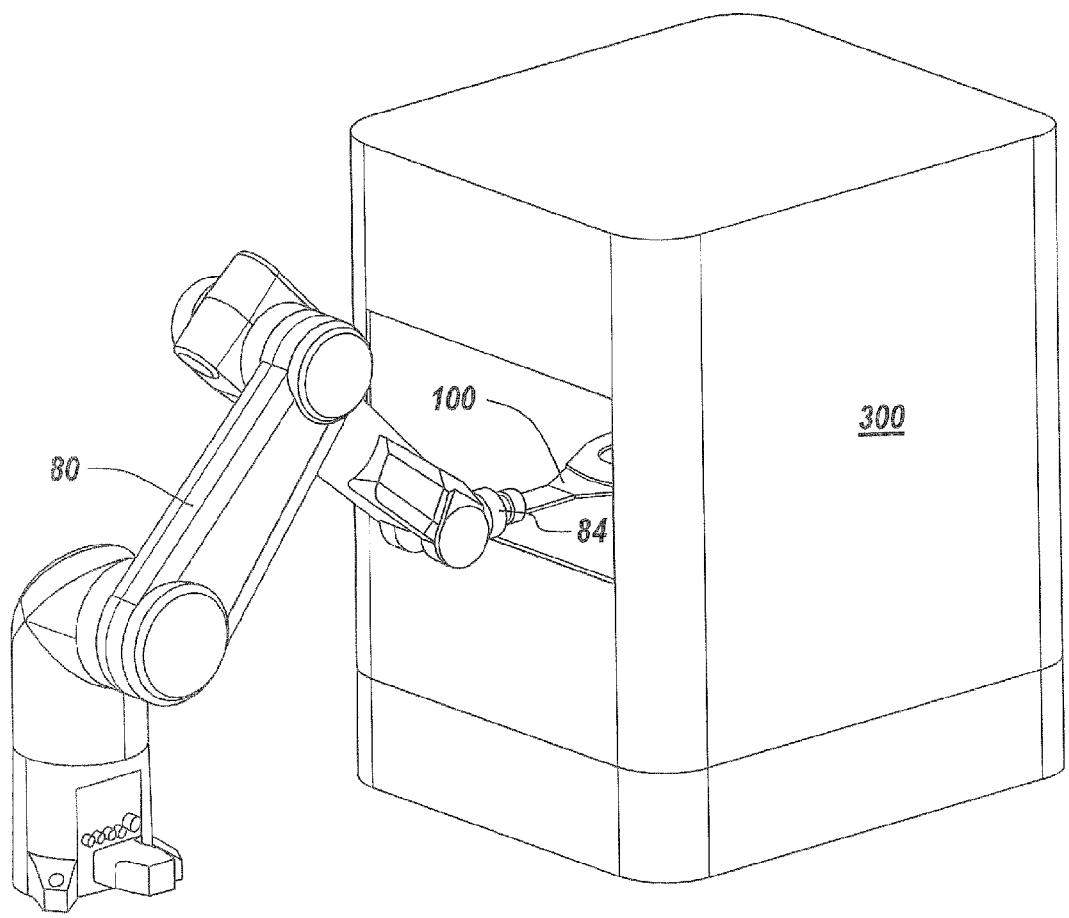

FIGS. 10A-10B depict the end effector 100 in use with a robotic arm 80, in accordance with the first exemplary embodiment of this disclosure. As shown, the end effector 100 may be removably attached to the robotic arm 80 (shown schematically in FIG. 10A) and may be interchanged with a different size or different shaped end effector depending upon the size and number of wafers that need to be supported. The robotic arm 80 may be positioned proximate to an alignment device 300 to allow for removal of the wafers 20, 30 carried on the end effector 100 from the alignment device 300. The robotic arm 80 may also be located near the bonding device (not shown), so the wafers 20, 30 can be transported between the processing units using a tool exchanger 84 at the end of the robotic arm 80. In one example, the tool exchanger 84 may be a Schunk Type SWS-011, but other tool exchanges may be used as well. In comparison to conventional transport fixtures, the end effector 100 has a reduced weight which significantly reduces robot loading. The end effector 100 also doesn't need to flip the pairs of aligned wafers 20, 30 about the axis of the interchange 82 of robot 80, e.g., to switch relative vertical positions of the top and bottom wafers 20, 30, respectively, which results in easier handling overall and a lower alignment shift risk.

Using the end effector 100 described relative to FIGS. 4-10B, a wafer pair 20, 30 may be placed in an aligner within an alignment device 300 and aligned in accordance with the methods and processes known in the art. Once aligned, the end effector 100 may be used to remove the aligned wafer pair 20, 30 from the aligner. FIGS. 11A-11H schematically depict cross-sectional illustrations of the steps of unloading an aligned wafer pair 20, 30 from an aligner with the end effector 100 of FIG. 4, in accordance with the first exemplary embodiment of this disclosure. While each of the figures generally illustrates only a single assembly 130a of the end effector 100, it is noted that the same functions may also be completed by the other assemblies included with the end effector 100, such that the same or similar functions are occurring at three or more points on the end effector at the same time or at differing but predetermined times.

Figure 11A:
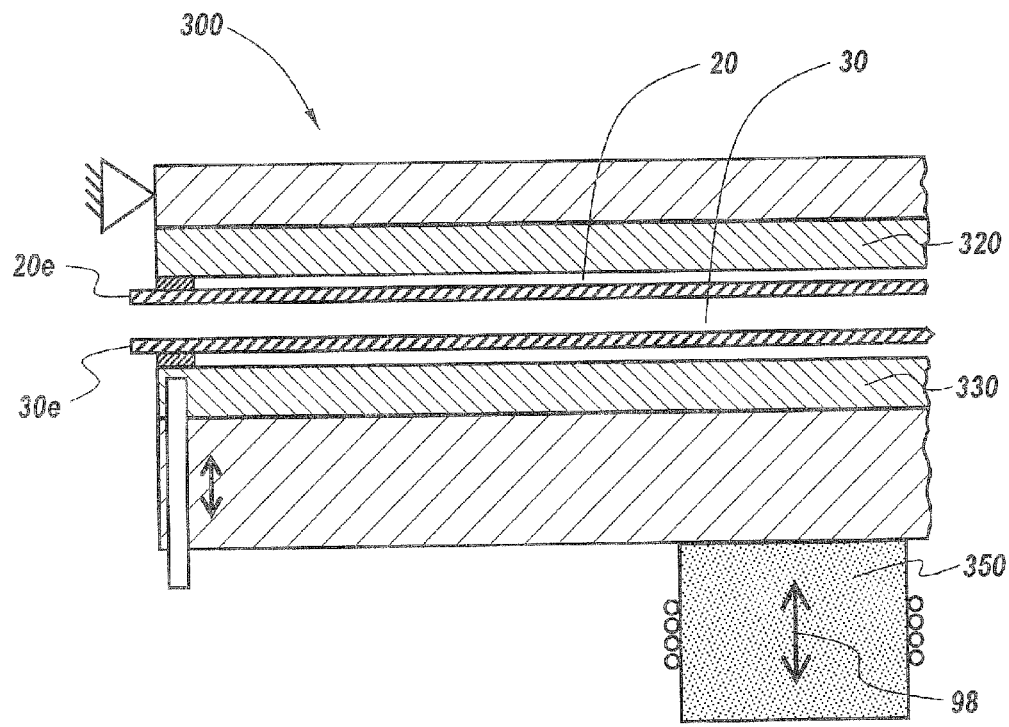
FIG. 11A-FIG. 11H schematically depict the steps of unloading an aligned wafer pair from an aligner with the end effector of FIG. 4, in accordance with the first exemplary embodiment of this disclosure.

First, FIG. 11A depicts the wafers 20 and 30 which have been aligned relative to each other and are held in contact with an upper wafer chuck 320 and a lower wafer chuck 330 of an alignment device 300. In the alignment device 300, the upper stage carrying the upper wafer chuck 320 is fixed while the lower stage carrying the lower wafer chuck 330 is movable vertically, i.e., in the z direction, as indicated at 98. The wafers 20, 30 have been aligned in the x direction, e.g., direction 92 in FIG. 11B, the y direction (out of the page), and angularly relative to one another such that the wafers are parallel. Wafers 20, 30 have edges 20e, 30e, respectively, and edges 20e, 30e protrude from the sides of chucks 320 and 330 of the alignment device 300.

Figure 11B:
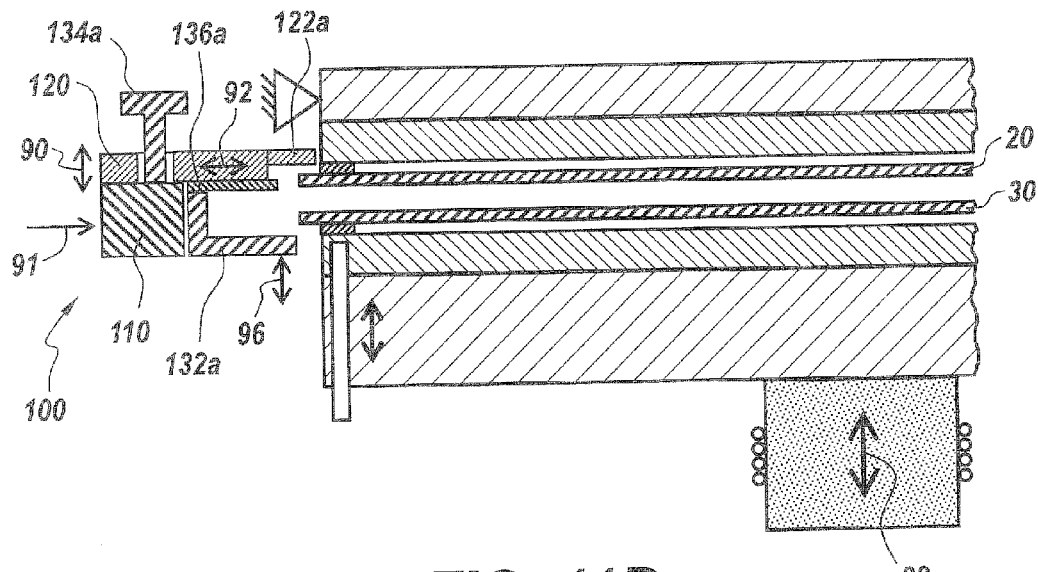

As shown in FIG. 11B, the end effector 100 is brought close to the sides of chuck 320 and 330 of the alignment device 300 along direction 91 to begin the unloading process. Shown schematically, the end effector 100 has the frame member 110 which may be fitted to a robot (not shown), while the floating carrier 120 is movable relative to the frame member 110 along direction 90. For simplicity in description, the frame member 110 may be considered to be fixed, in that, it is stationary relative to the end portion of the robot to which the end effector 100 is attached, while the floating carrier 120 is considered to be movable, in that, it is movable relative to the end portion of the robot to which the end effector 100 is attached. The limit-feature 134a is connected to the frame member 110 and positioned within the hole 135a in the floating carrier 120, where the clearance spaced between the limit-feature 134a and the sidewall of the hole 135a allow slight lateral movements of the floating carrier 120 relative to the frame member 110 along direction 92.

Figure 11C:
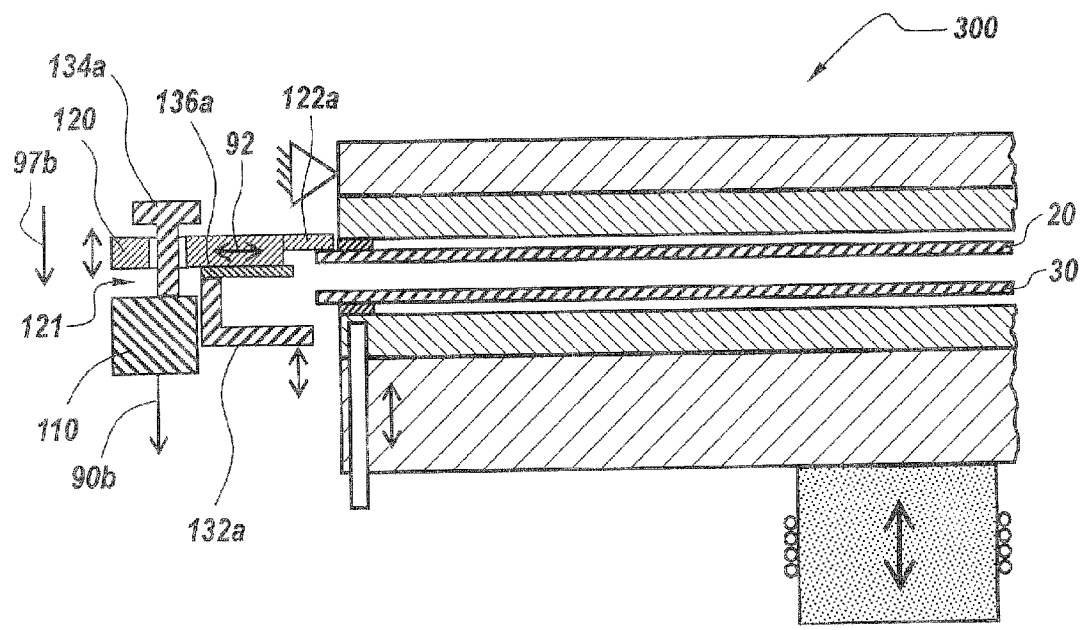

In this starting state shown in FIG. 11B, the end effector 100 is positioned proximate to the alignment device 300 in an open configuration, with the various clamps and spacing devices retracted. The floating carrier 120 is in a coupled or contacted position with the fixed carrier 110. Next, as shown in FIG. 11C, the floating carrier 120 is decoupled from the frame member 110 while the end effector 100 moves down along direction 97b, the z direction. Decoupling of the floating carrier 120 from the frame member 110 may be critical in preventing small vibrations in the robot carrying the end effector 100 from being transferred to the alignment device 300 and causing unintended movements of the wafers 20, 30 and causing them to become misaligned. The movement of the end effector 100 may be only a few millimeters until vacuum pads 122a are in contact with the top surface of edge 20e of wafer 20 and the distance between the fixed frame 110 and the floating carrier 120 increases so that the carrier spacer flags 136a, 136b, 136c are below the bottom surface of edge 20e of wafer 20. In this position, optionally, the vacuum pads 122a may be activated to effectively connect or lock the floating carrier 120 to the top wafer 20.

Figure 11D:
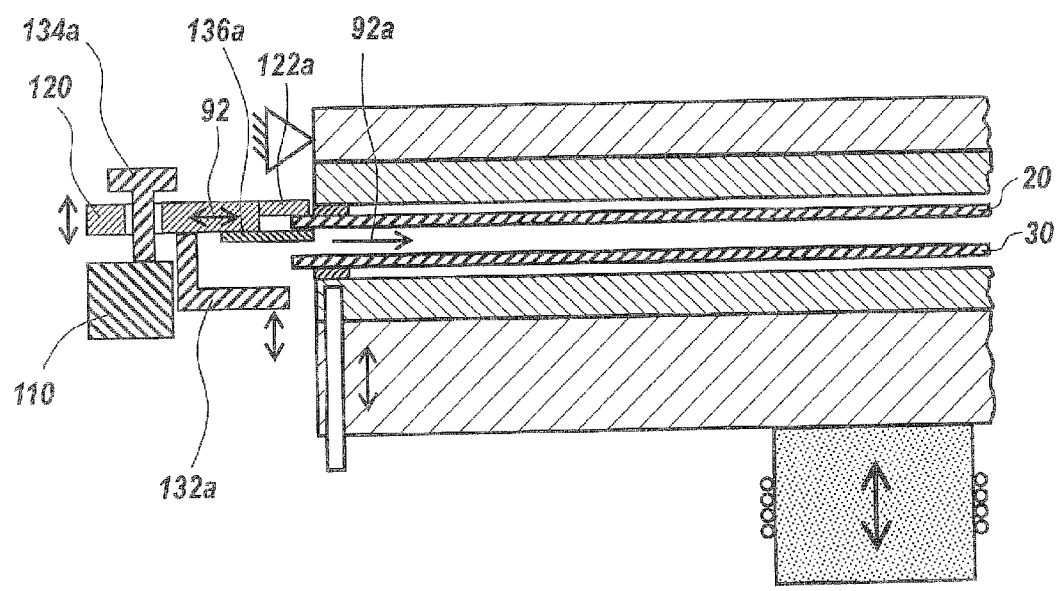
Figure 11E:
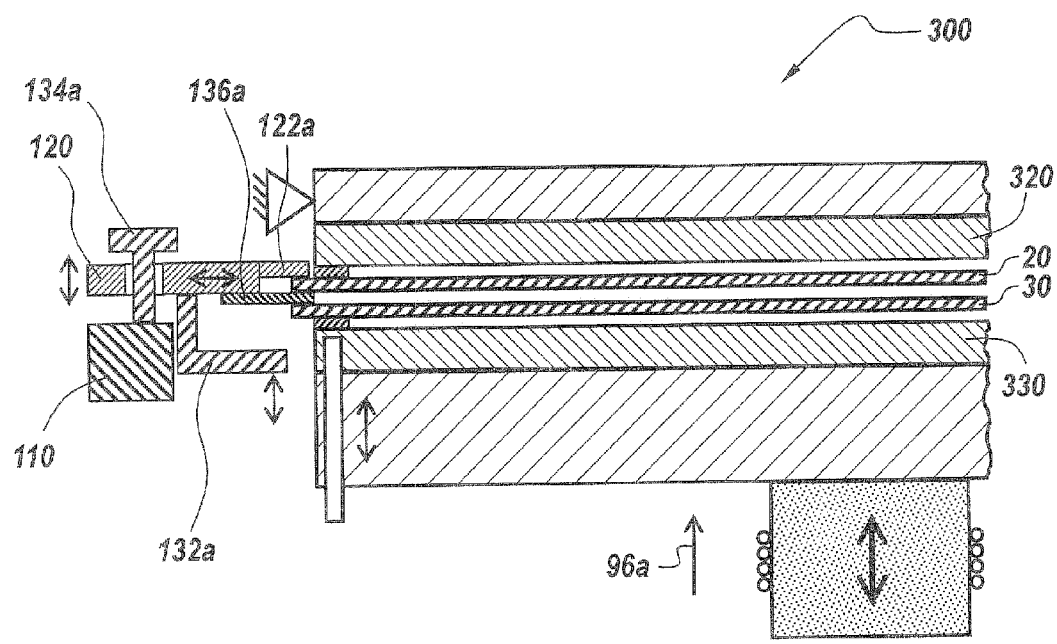
Figure 11F:
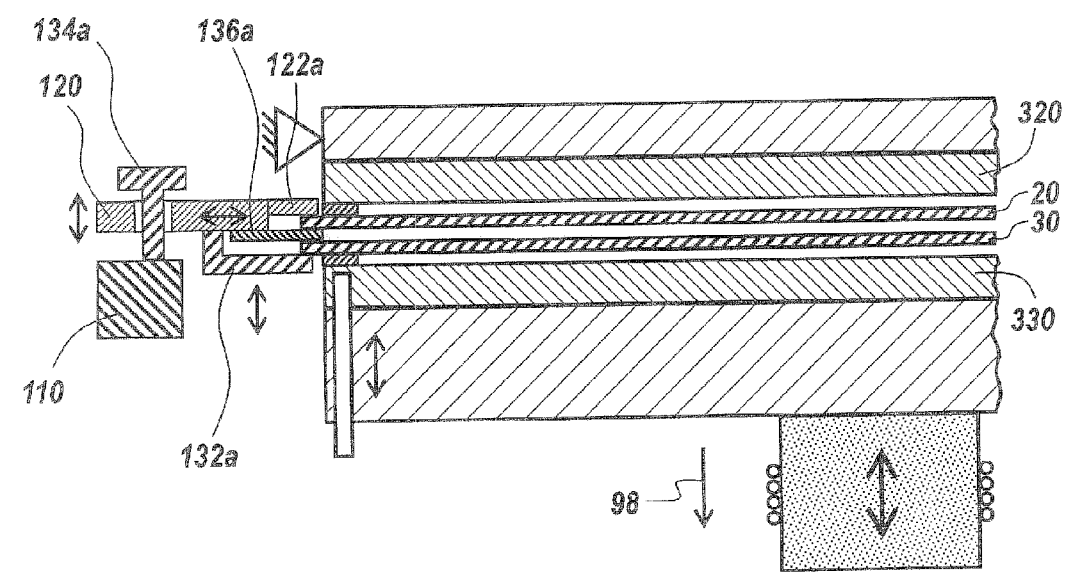
Figure 11G:
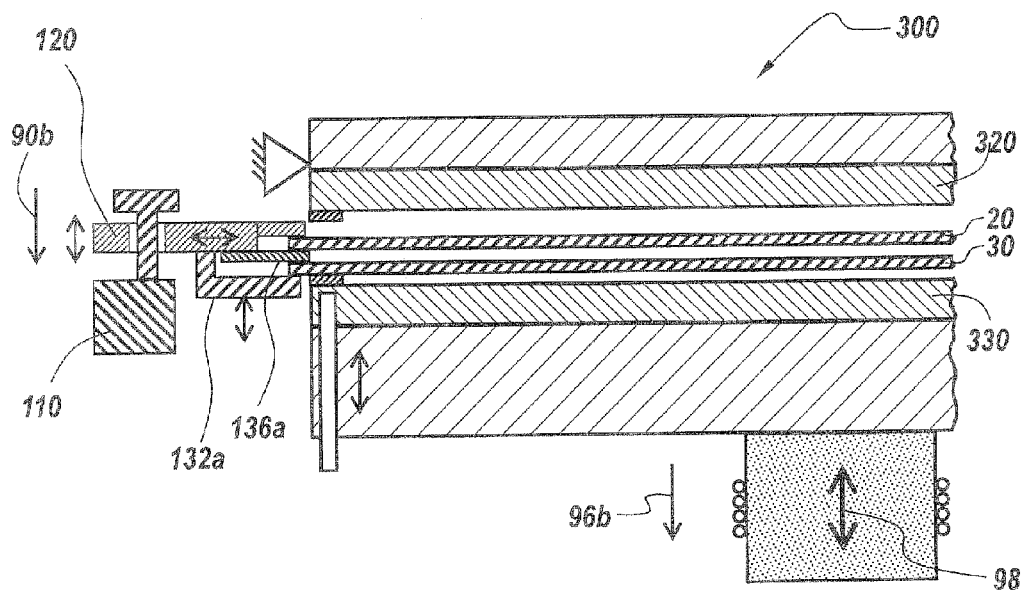
Figure 11H:
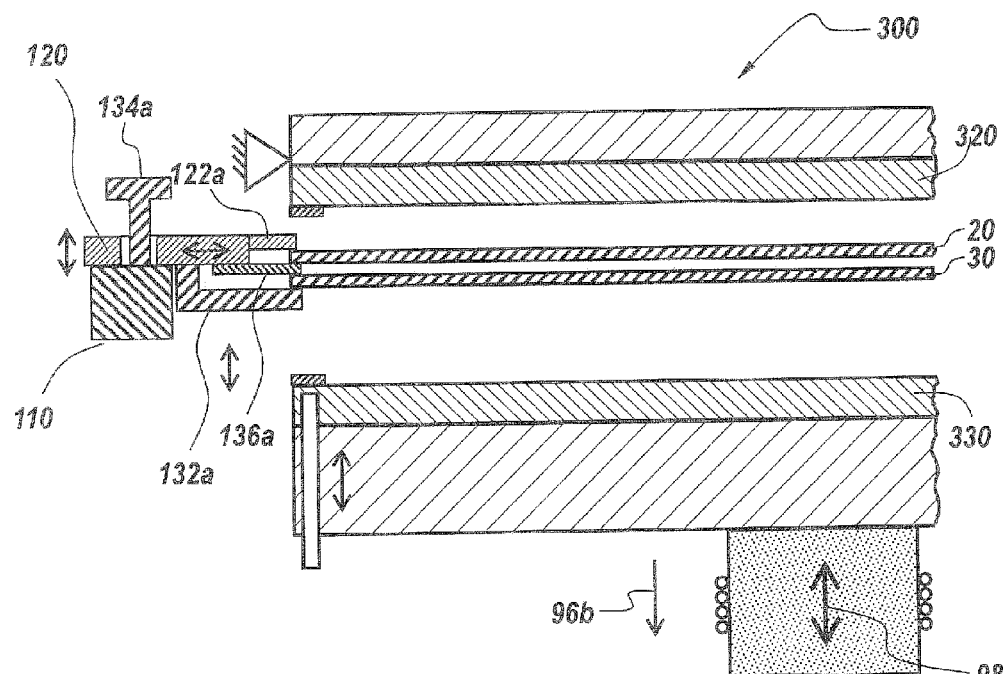

Next, in FIG. 11D, the spacer flag 136a moves horizontally along direction 92a, the x direction, so that it is positioned between the bottom surface of edge 20e of wafer 20 and the top surface of edge 30e of wafer 30. Spacer flags 136a, 136b, 136c, are flexible in the z-direction so that they can comply with the surfaces of the wafers 20e and 30e, without applying any significant force onto the surfaces. Next, as shown in FIG. 11E, the lower wafer chuck 330 is moved up along direction 96a until the top surface of edge 30e of wafer 30 touches the bottom surface of spacer flag 136a, which forms the gap between the wafers 20, 30. Next, clamp 132a is moved to contact the bottom surface of edge 30e of wafer 30 and to clamp the edges 20e, 30e of wafers 20, 30, respectively together with the inserted spacer flag 136a in between them, as shown in FIG. 11F. In this position, the wafers 20, 30 are locked together with the spacer flag 136a therebetween, all of which are held by the end effector 100. To release the wafer pair 20, 30 from the alignment device 300, the upper wafer chuck 320 may be purged and then the lower wafer chuck 330 is moved down along the z axis in direction 96b to a mid-position, thereby creating a spaced distance between the top wafer 20 and the upper wafer chuck 320. Then the vacuum of the lower wafer chuck 330 is released and it is moved further down the z direction until the aligned wafer pair 20, 30 is held entirely by the end effector 100 at the edges 20e, 30e, and is ready to be transported out of the alignment device 300, as shown in FIG. 11H.

Figure 12:
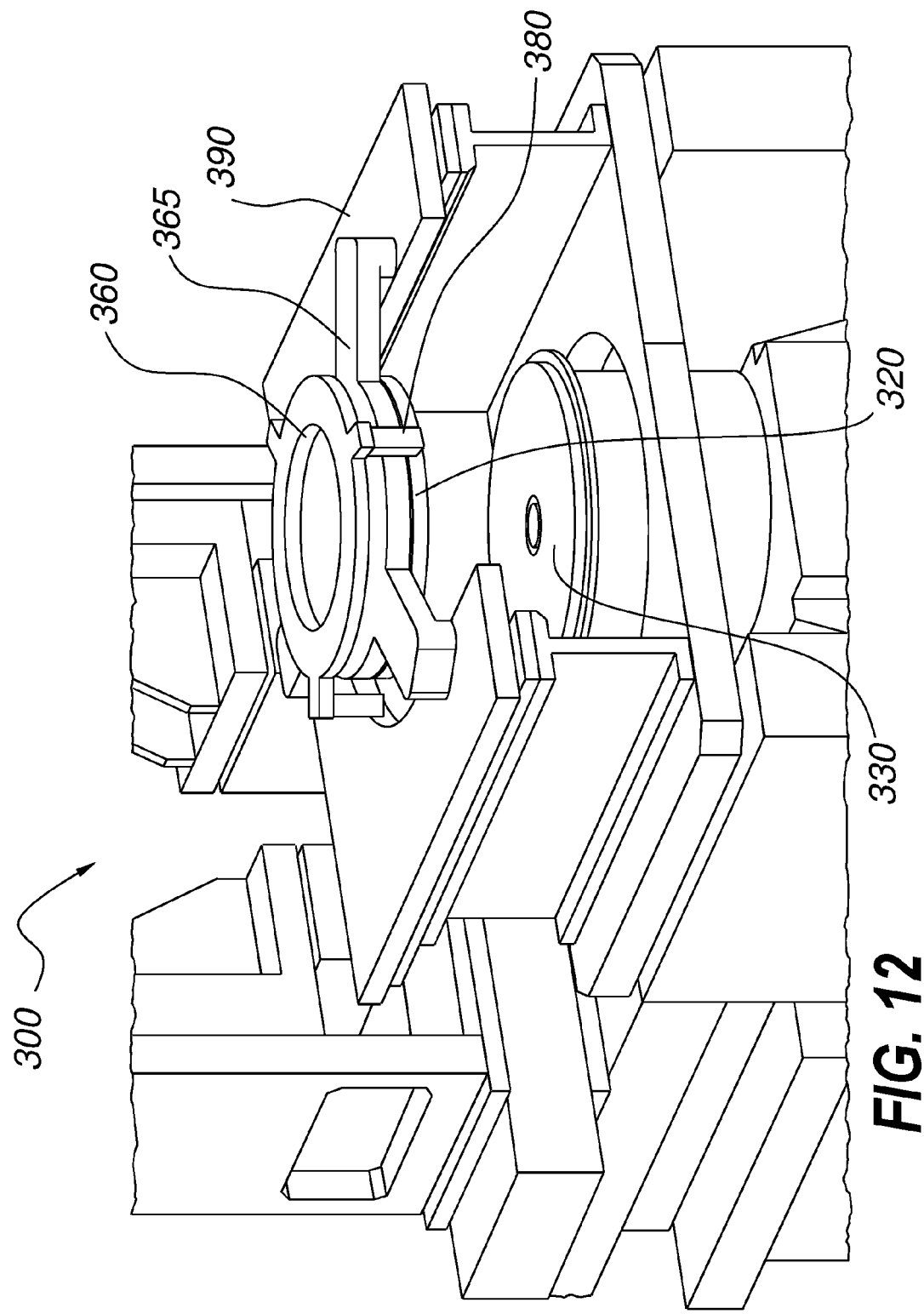
FIG. 12 is a schematic diagram of a wafer aligner, in accordance with the first exemplary embodiment of this disclosure.

FIG. 12 is a schematic diagram of a wafer alignment device 300, in accordance with the first exemplary embodiment of this disclosure. The wafer alignment device 300 may serve as an example of the aligner in which the process of FIGS. 11A-11H is used. As shown in FIG. 12, the alignment device 300 may further include a spacer flag carriage 360 with pneumatic Z-axis, a static support bridge 365, a support frame 390, the top substrate chuck 320, the bottom substrate chuck 330 and the WEC spacer flag mechanisms 380, which are also described in U.S. Pat. No. 8,139,219 entitled "APPARATUS AND METHOD FOR SEMICONDUCTOR WAFER ALIGNMENT", which is commonly owned and the contents of which are expressly incorporated herein by reference.

Figure 13A:
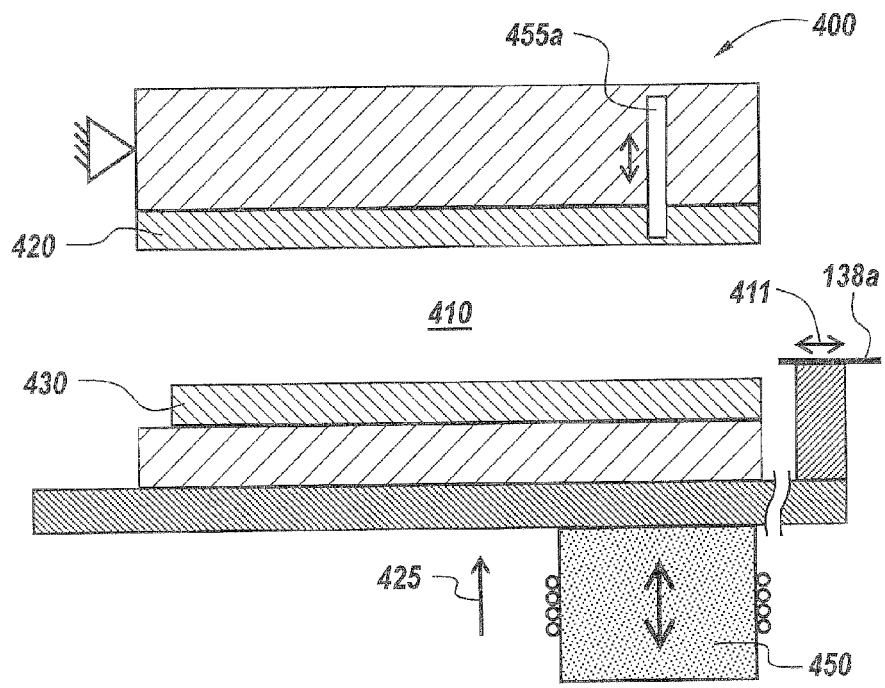
FIGS. 13A-13I schematically depict the steps of loading an aligned wafer pair into a bonder with the end effector of FIG. 4, in accordance with the first exemplary embodiment of this disclosure.

FIGS. 13A-13H schematically depict cross-sectional illustrations of the steps of loading an aligned wafer pair into a bonder with the end effector of FIG. 4, in accordance with the first exemplary embodiment of this disclosure. One of the processing stations where the aligned wafers 20, 30 can be transported and loaded with the robotic arm 80 and the end effector 100 is a bonder 400. FIG. 13A illustrates the bonder 400 in an idle state, prior to the wafers being placed within the bonder chamber 410. The bonder 400 includes a bottom chuck 430 and a top chuck 420 positioned below and above the bonder chamber 410, both of which are capable of maintaining a heated state to bond the wafers. One or both of the top and bottom chucks 420, 430 may be movable vertically along the z axis. In many bonder 400 designs, only one of the chucks will be movable while the other will remain stationary. Bonder spacers 138a are included in the bonder 400 and may be attached to the lower stage of the bonder 400, such that the bonder spacer flag 138a moves vertically with the bottom chuck 430, thereby maintaining a constant relative position to the bottom chuck 430. While each of the figures generally illustrates only a single bonder spacer flag 138a for clarity in disclosure, it is noted that three or more bonder spacer flags 138a, 138b, 183c (FIG. 7) may be used in the bonder 400 such that the same or similar functions are occurring at three or more points in the bonder at the same time or at differing but predetermined times.

The bonding process using the end effector 100 differs substantially from the bonding process using conventional transport fixtures. Conventional transport fixtures transport aligned wafers into a bonding device and must remain in the bonding device throughout the duration of the bonding process. In contrast, the end effector 100 of the subject disclosure allows for the transportation of aligned wafers into a bonding device and then is removed from the bonding chamber prior to the bonding process. Accordingly, the end effector 100 may be subjected to only brief durations of idle temperatures in the bonding devices, e.g., approximately 300° C., as compared to the 500° C. temperatures and hour-long durations that conventional transport fixtures are subjected to. As a result, the end effector 100 experiences less mechanical and thermal stress and requires less maintenance, which acts to increase efficiency and reduce costs.

As an overview, bonding in accordance with this disclosure is achieved, in part, due to the use of bonder spacer flags 138a which are inserted between the wafers thereby allowing the end effector spacer flags 136a, 136b, and 136c to be removed, and the entire end effector 100 to be removed from the bonding chamber. The aligned and spaced wafers are then pinned with pins 455a, 455b and 455c and then a bonding force is applied on the pinned wafers 20, 30. Once bonding is complete, the end effector 100 may be used to remove the bonded wafers from the bonding device.

Figure 13B:
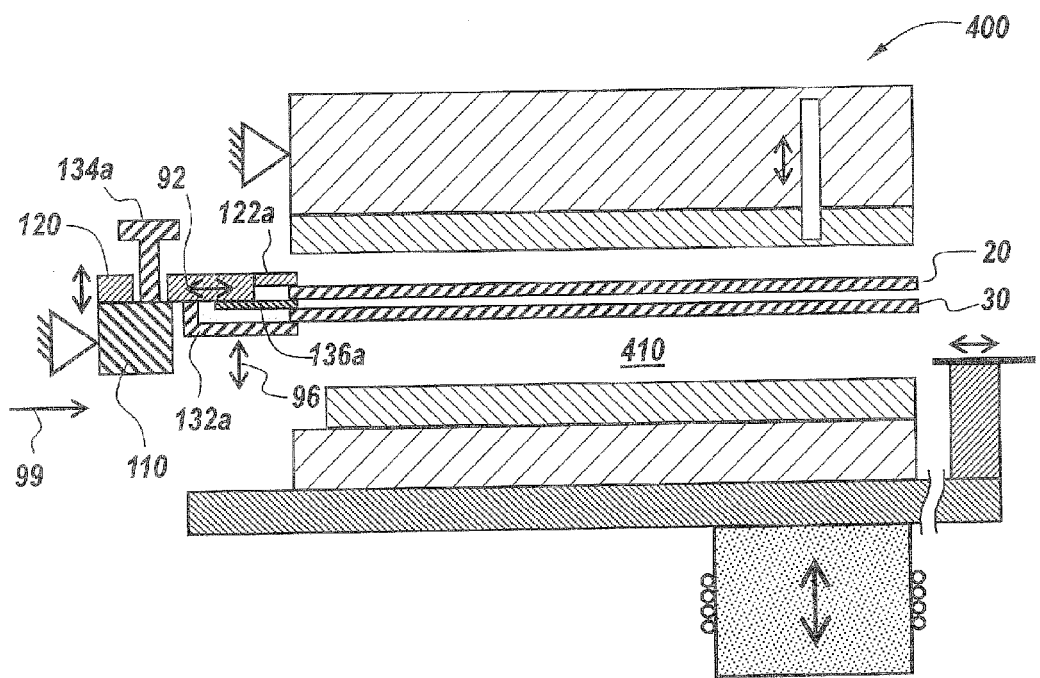

Additional details of the process for loading the aligned pair of wafers 20, 30 in the bonder 400 with the end effector 100 are provided relative to FIGS. 13B-13H. Referring first to FIG. 13B, aligned and clamped wafers 20 and 30 are carried by the end effector 100 and inserted into the bonder chamber 410. In this bonder configuration, top chuck 420 is fixed and bottom chuck 430 is movable along direction 425 via z-drive 450, but it is noted that the bonder 400 may have any configuration of movable and fixed chucks. As previously mentioned, the end effector holds the edges 20e, 30e, of wafers 20, 30 with clamping assemblies 130a, 130b, and 130c, and wafers 20, 30 are inserted into the bonder chamber 410 along direction 99, so that edges 20e, 30e protrude from the loading side of the bonder 400, as shown in FIG. 13B. In this starting state, the floating carrier 120 is in contact with the frame member 110 and wafer edges 20e, 30e are clamped together.

Figure 13C:
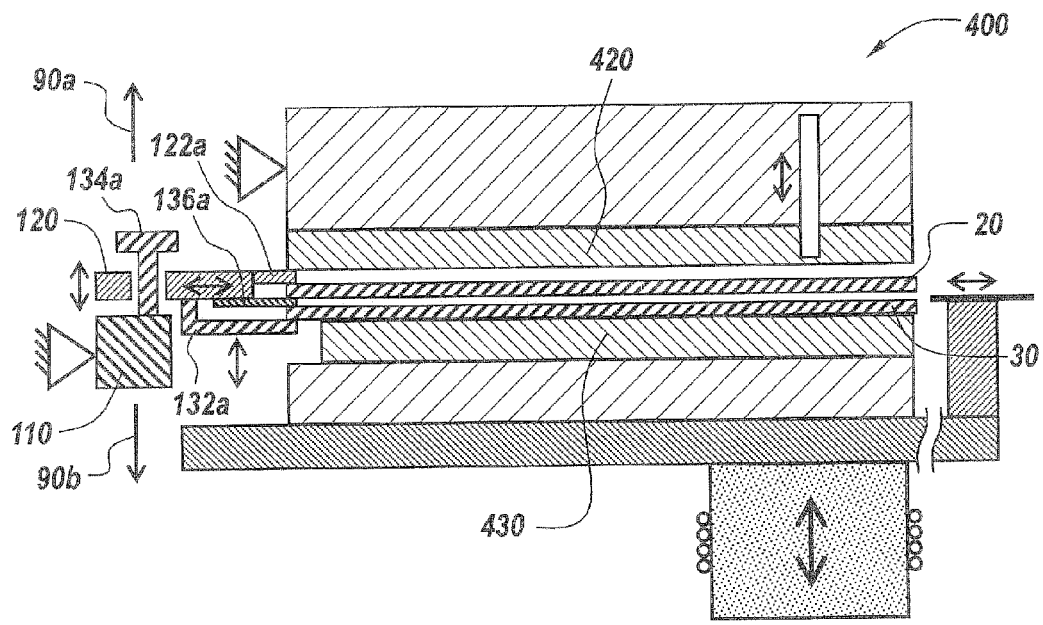
Figure 13D:
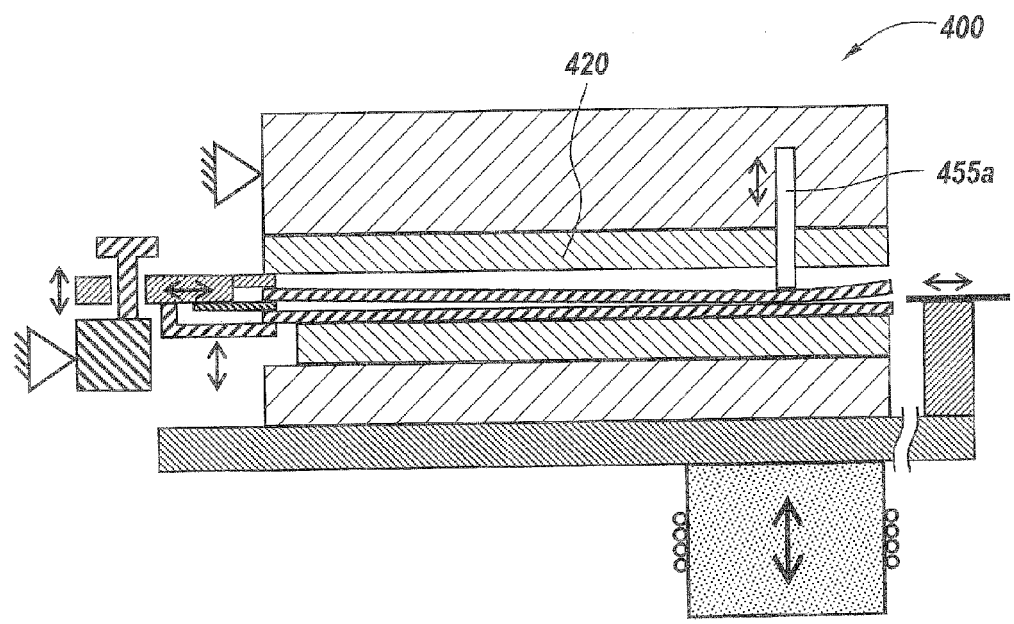

Next, as shown in FIG. 13C, the floating carrier 120 with the clamped wafers 20, 30 decouples from the frame member 110 such that it moves down along direction 90b and wafers 20, 30 are placed on the bottom chuck 430, so that the bottom surface of wafer 30 is in contact with the top surface of the bottom chuck 430. In one of many alternatives, the floating carrier 120 with the clamped wafers 20, 30 could move up along direction 90a and wafers 20, 30 are placed on the bottom surface of the top chuck 420, so that the top surface of wafer 20 is in contact with the bottom surface of the top chuck 420. As shown, the bottom chuck 430 may have one or more cutouts 432 along portions of the perimeter of the bottom chuck 430, which may allow for adequate clearance for the end effector 100 to place the wafers 20, 30 within the bonder 400, e.g., so the outer edges of the wafers 20, 30 can be substantially aligned with the perimeter of the top and bottom chucks 420, 430. Next, while the end effector spacer flag 136a remains in a position between the wafers 20, 30, one or more pins 455a are brought into contact with the top surface of wafer 20 in one or more locations, as shown in FIG. 13D.

Figure 13E:
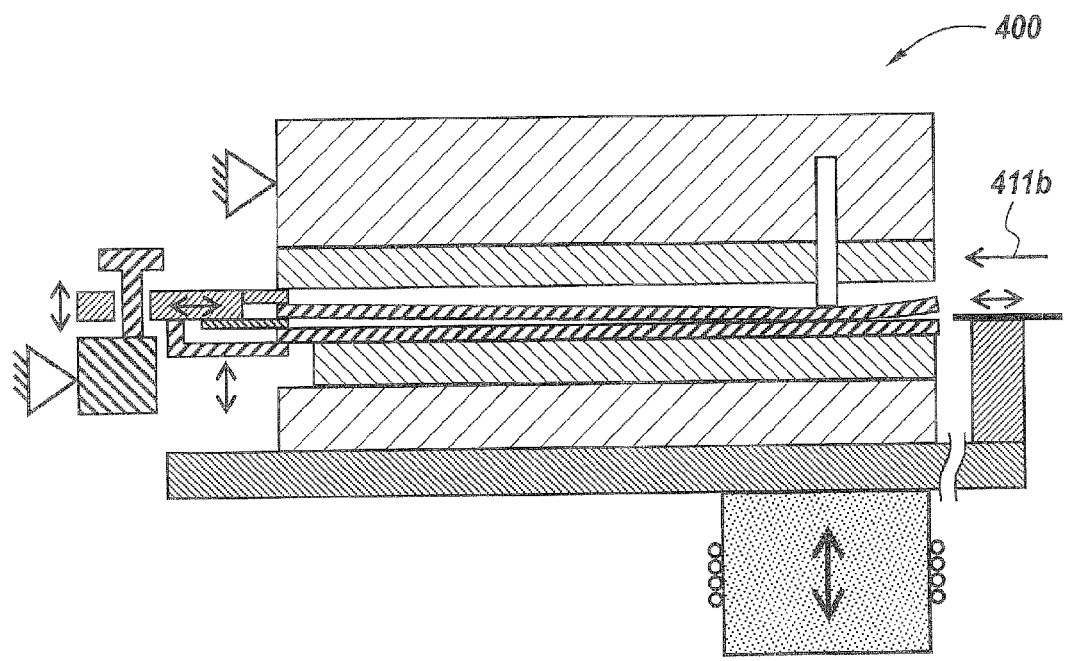
Figure 13F:
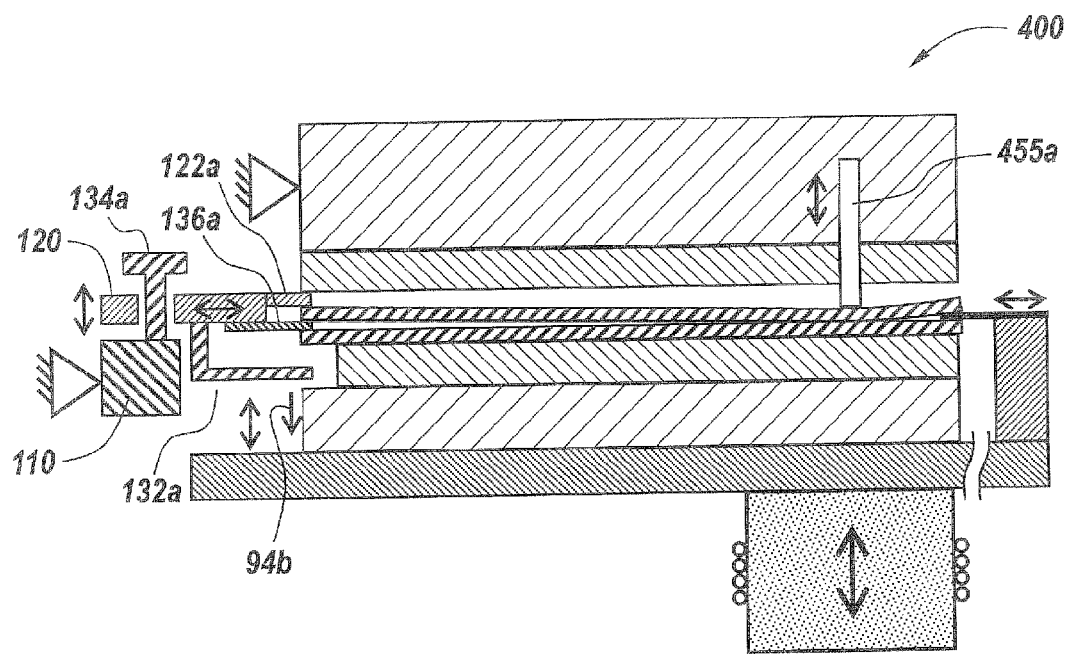

Within the industry, it is desirable to bond wafers as efficiently as possible to increase production. One technique for increasing the production of bonded wafer pairs is to maintain a high temperature in the bonder 400 even when it is not actively bonding wafers, thereby decreasing the time required for the bonder 400 to get up to an operating temperature at each cycle. However, placing aligned wafers within an already heated bonder 400, e.g., on the order of 400° C., can affect the alignment of the wafers 20, 30. For example, subjecting the wafers 20, 30 to this type of heated environment can result in the wafers 20, 30 expanding radially, so it is desirable to pin the wafers 20, 30 together quickly and as accurately as possible. While the wafers 20, 30 can be pinned at different locations, it may be preferable to pin the wafers 20, 30 together at a center point thereof instead of along a radial edge, thereby preventing situations where thermal expansions of the wafers 20, 30 from an offset point causes misalignments. In FIGS. 13D-13F, pin 455a is shown located at a center of the wafers 20, 30, but the number of pins 455a and the locations of those pins can vary, as discussed relative to FIGS. 15A-15C.

Then, as shown in FIG. 13E, while the wafers 20, 30 are retained with the one or more pins 455a, one or more of the bonder spacer flags 138a, positioned proximate to edge portions of the wafers 20, 30, are inserted between wafers 20, 30 along direction 411b. The bonder spacer flags 138a may be thinner than the end effector spacer flag 136a, and therefore they can be inserted between the wafers 20, 30 clamped around the end effector spacer flag 136a. In one example, the bonder spacer flags 138a may be approximately 100 microns whereas the end effector spacer flag 136a may be approximately 200 microns.

Figure 13G:
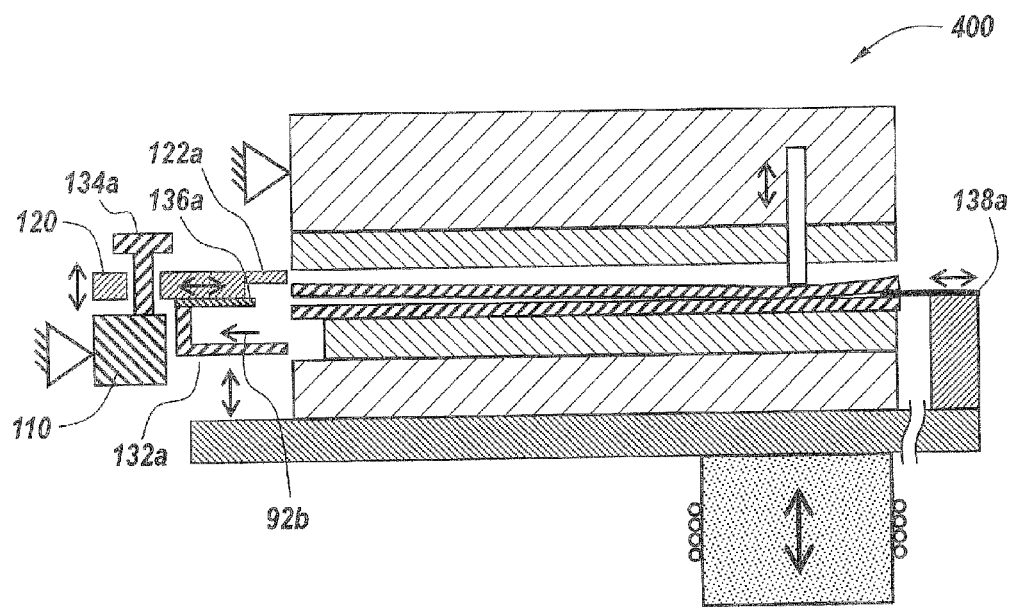

Next, clamps 132a, 132b, 132c are released and they disengage from the edge 30e of the bottom surface of wafer 30, as shown in FIG. 13F. It is noted that the clamps may be removed in accordance with predetermined routines, such as in unison, sequentially, or a combination thereof. After release of the clamps 132a, 132b, and 132c, the end effector spacer flag 136a is removed from the space between the two wafers 20, 30 along directions 92b, as shown in FIG. 13G. The three or more bonding spacer flags 138a remain in a position between the wafers 20, 30 about the perimeter of the wafers 20, 30. Commonly, the bonder spacer flags 138a will be positioned close to the locations of the end effector spacer flag 136a along the perimeter of the wafers 20, 30, as shown in FIG. 9. After the end effector spacer flags 136a are removed, a spaced gap between the wafers 20, 30 may still be present, as shown in FIGS. 13G-13H, due to the nearby bonder spacer flag remaining between the wafers 20, 30.

Figure 13H:
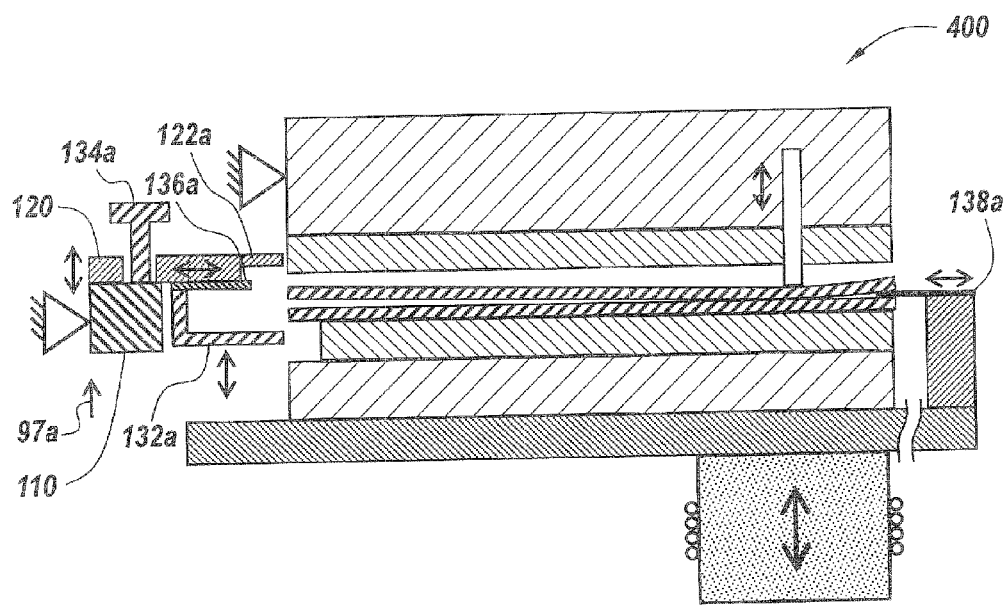
Figure 13I:
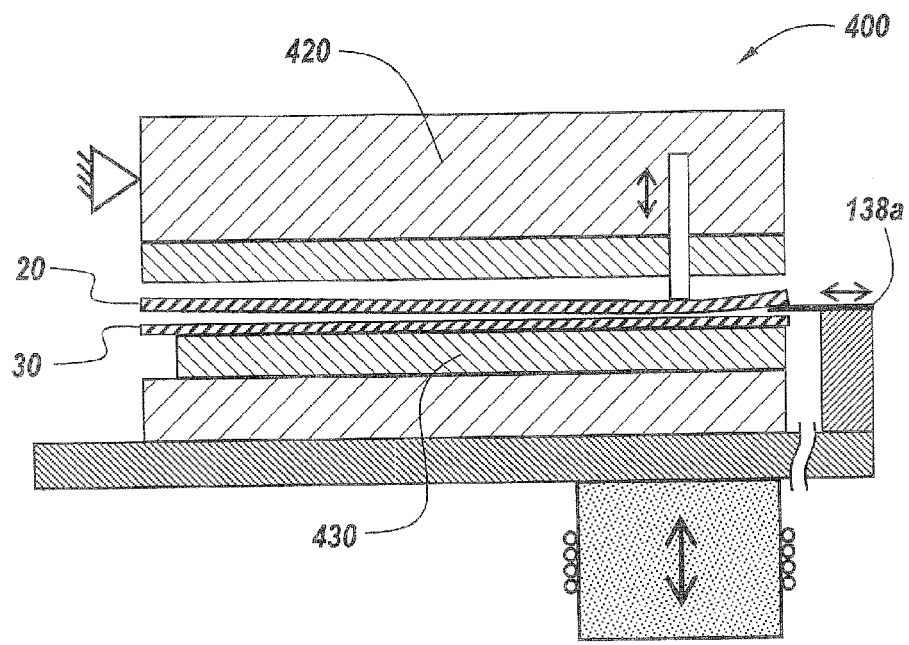

Finally, the end effector 100 moves up along direction 97a until the vacuum pads 122a, 122b, 122c, disengage from the top surface of edge 20e of wafer 20, leaving behind the pinned wafers 20, 30 on top of the bottom chuck 430, as shown in FIG. 13H. At this stage, the end effector 100 is removed from the bonder 400 entirely, as shown in FIG. 13I, and the wafer bonding can begin. In the initial stages of the wafer bonding process, wafers 20, 30 are bonded together about the bonder spacer flags 138a. Prior to the force application, the bonder spacer flags 138a are be removed. After completion of the bonding process, the bonded wafer pair 20, 30 is removed from the bonder 400 with the end effector 100.

Figure 14:
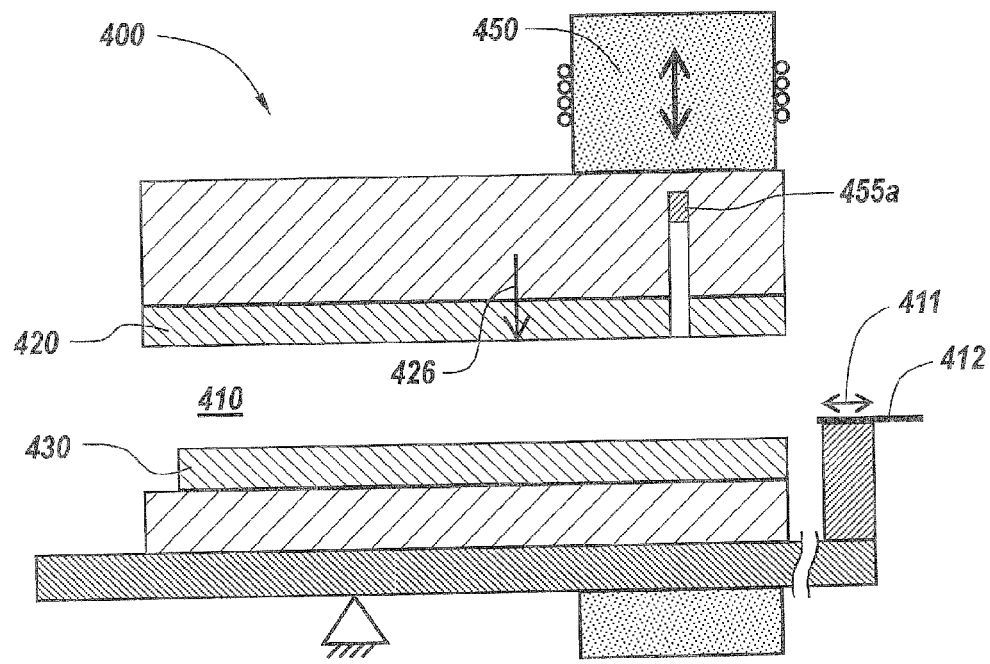
FIG. 14 depicts loading an aligned wafer pair into a bonder with the end effector of FIG. 4, in accordance with the first exemplary embodiment of this disclosure.

FIG. 14 depicts a bonder positioned to receive the end effector of FIG. 4, in accordance with the first exemplary embodiment of this disclosure. Specifically, the bonder 400 of FIG. 14 may have differently designed fixed and movable components. In FIGS. 13A-13H, the bonder 400 is designed so that the upper chuck 420 is fixed and the lower chuck 430 is movable along the z axis. In the design of the bonder 400 shown in FIG. 14, the lower chuck 430 is fixed and the upper chuck 420 moves along direction 426, until the bottom surface of the upper chuck 420 contacts the top surface of the top wafer. All variations on movement of the top and/or bottom chucks 420, 430 of a bonder 400 may be used with the devices, system, and methods of this disclosure.

Figure 15A:
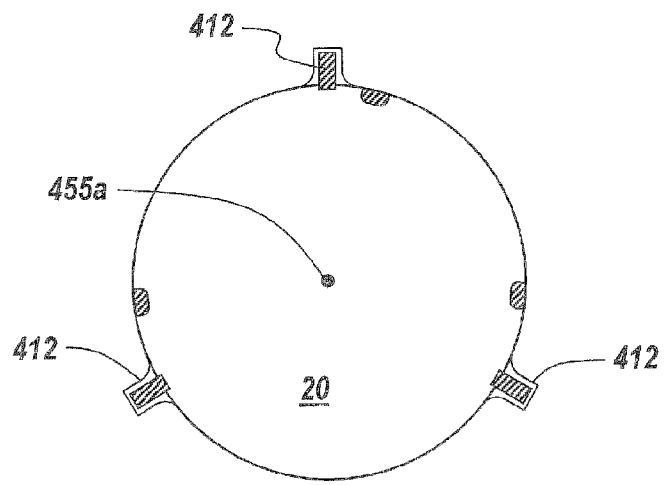
FIG. 15A depicts a schematic view of pinning two wafers via a single center pin, in accordance with the first exemplary embodiment of this disclosure.
Figure 15B:
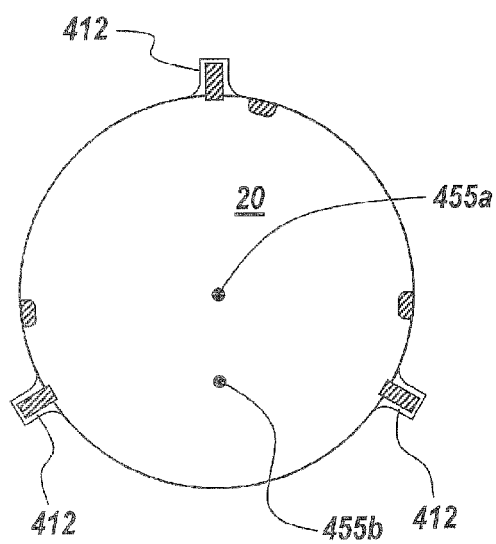
FIG. 15B depicts a schematic view of pinning two wafers via a center pin and an off-center anti-rotation pin, in accordance with the first exemplary embodiment of this disclosure.
Figure 15C:
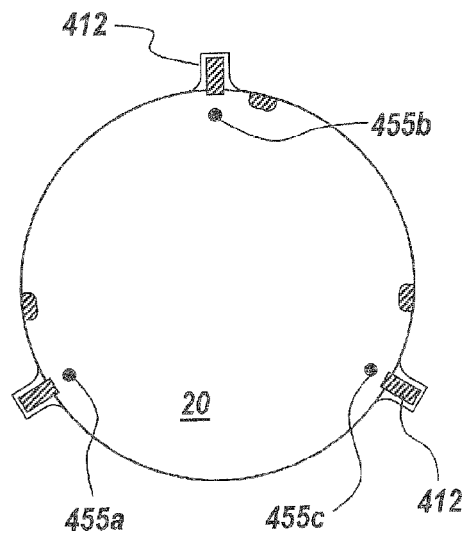
FIG. 15C depicts a schematic view of pinning two wafers via three peripheral pins, in accordance with the first exemplary embodiment of this disclosure.

FIGS. 15A-15C illustrate variations in the pins used in a bonder. FIG. 15A depicts a schematic view of pinning two wafers via a single center pin, in accordance with the first exemplary embodiment of this disclosure. FIG. 15B depicts a schematic view of pinning two wafers via a center pin and an off-center anti-rotation pin, in accordance with the first exemplary embodiment of this disclosure. FIG. 15C depicts a schematic view of pinning two wafers via three peripheral pins, in accordance with the first exemplary embodiment of this disclosure. With reference to FIGS. 15A-15C together, one or more of the pins 455a, 455b, 455c may be brought into contact with the top surface of wafer 20 in one or more different locations. It may be preferable to use a single pin 455a positioned in the center of the wafers 20, 30, as shown in FIG. 15A. Using a single pin 455a in the center may allow the wafers 20, 30 to thermally expand without experiencing misalignments.

In one alternative, the wafers 20, 30 may be pinned with two pins 455a, 455b, as shown in FIG. 15B. Here, pin 455a is a center pin and pin 455b is an anti-rotation pin, such that pin 455b prevents a rotation of the wafers 20, 30. In this design, the center pin 455a may apply a greater pinning force to the wafers 20, 30 than the anti-rotation pin 455b. Additionally, the off centered pin 455b may be radially compliant, in that it may be movable along a radius of the wafers 20, 30 to accommodate for thermal expansion of the wafers. In another alternative shown in FIG. 15C, three pins 455a, 455b, 455c may be used, where they are arranged at the periphery of wafers 20, 30, such as near each of the bonder spacer flags 138a. They may be spaced substantially equidistantly about the wafer 20, 30 perimeter, such as at 120 degrees apart from each other. It is also possible to use a combination of these configurations or other pin configurations not explicitly shown. For example, it may be desirable to use the center pin of FIG. 15A with the three perimeter pins of FIG. 15C.

Figure 16:
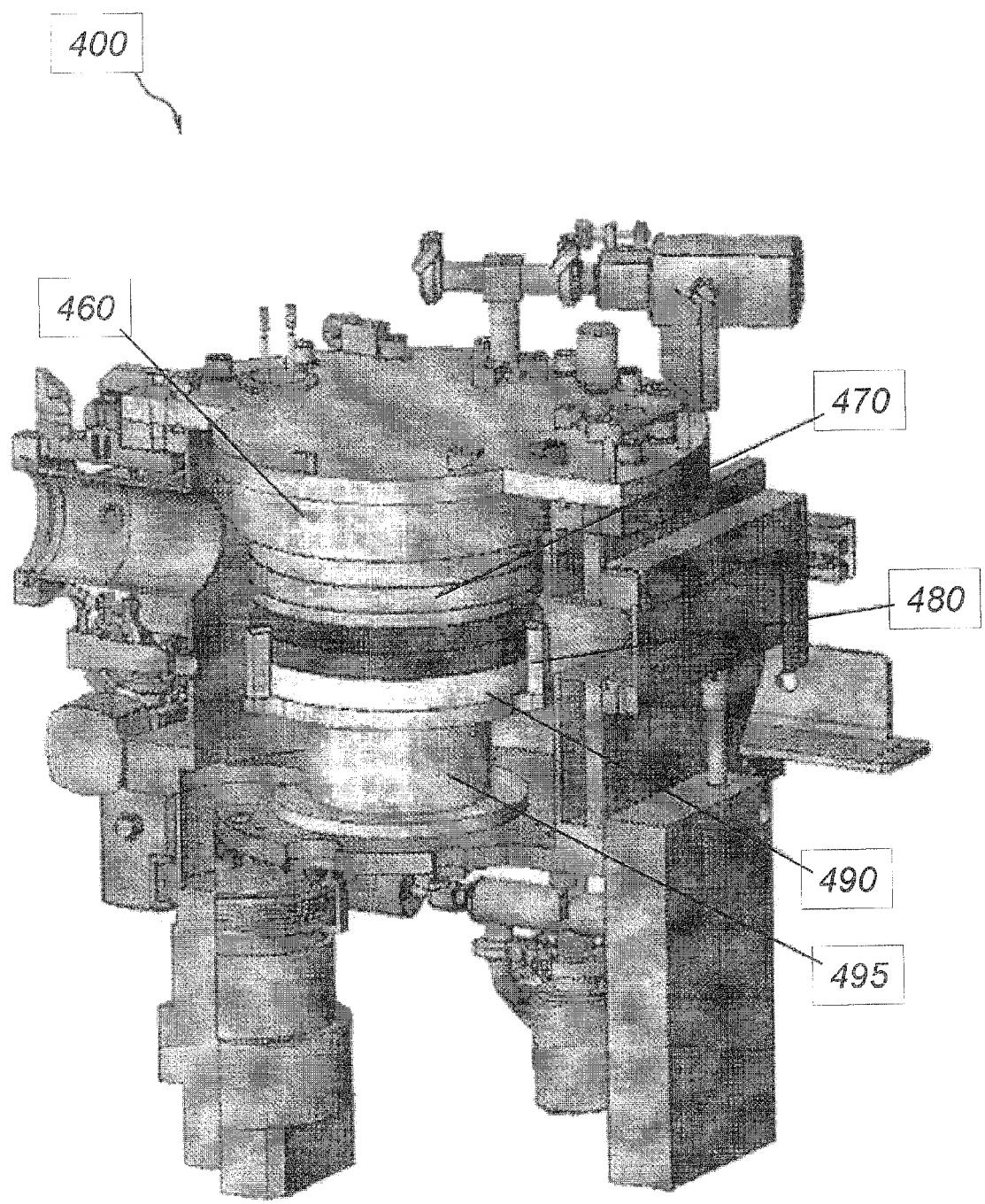
FIG. 16 is a schematic diagram of an exemplary wafer bonder, in accordance with the first exemplary embodiment of this disclosure.

FIG. 16 is a schematic diagram of an exemplary wafer bonder, in accordance with the first exemplary embodiment of this disclosure. As shown in FIG. 16, the bonder 400 further includes a pressure head 460 with membrane force and motor positioning, a bond head 470 with pressure plate and upper pins 455, bonder spacer flag mechanism 480, lower heater 490 with sandwich plate and purge features and a static Z-axis support column 495. These and other components of the bonder 400 are described in U.S. Pat. No. 7,948,034 entitled "APPARATUS AND METHOD FOR SEMICONDUCTOR BONDING", which is commonly owned and the contents of which are expressly incorporated herein by reference.

Figure 17:
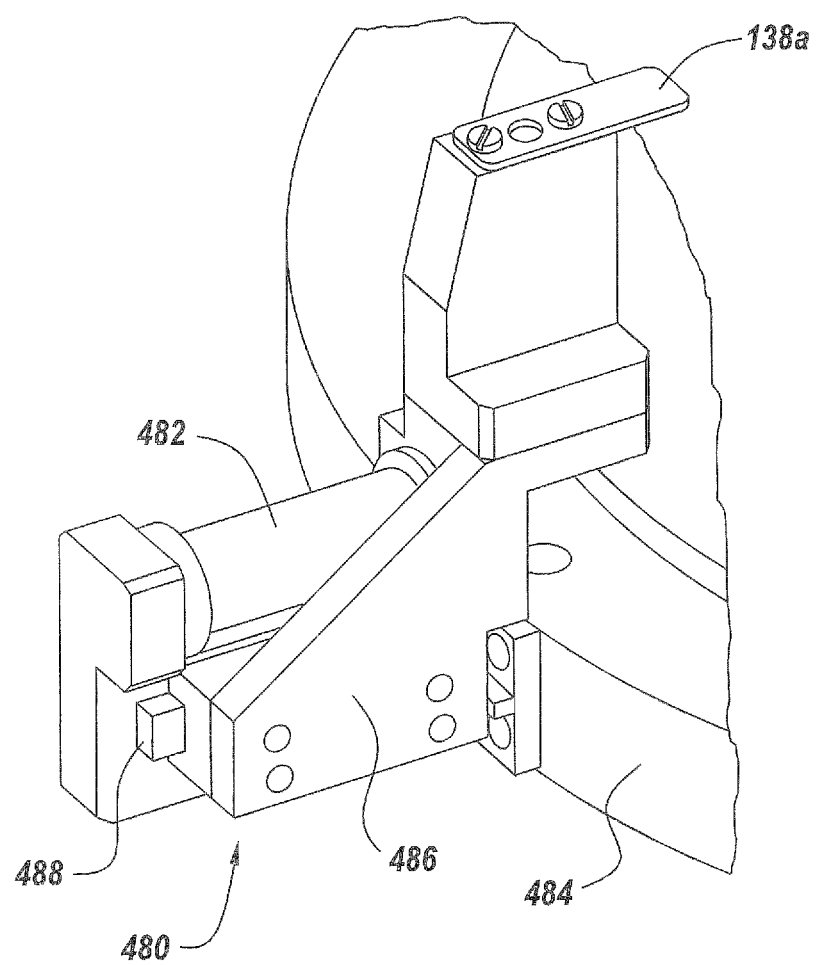
FIG. 17 is a schematic diagram of an exemplary bonder spacer flag mechanism used with a wafer bonder, in accordance with the first exemplary embodiment of this disclosure.

FIG. 17 is a schematic diagram of an exemplary bonder spacer flag mechanism 480 used with a wafer bonder 400, in accordance with the first exemplary embodiment of this disclosure. With reference to FIGS. 16-17, the bonder spacer flag mechanism 480 may be used to move the bonder spacer flags 138a, 138b, 138c (shown in FIG. 7) between inserted and retracted positions between aligned wafer pairs. In one example, the bonder spacer flag mechanism 480 may have a pneumatic piston 482 mounted to a ring 484 positioned around the Z-axis column 495 and below the lower heater 490. The pneumatic piston 482 carries a shelf 486 that supports the bonder spacer flag 138a. When the pneumatic piston 482 is activated, it is movable towards and away from the center of the bonding field in a radial direction. The movement of the bonder spacer flag 138a may be guided by a rail 488 which the shelf 486 is slidable on. These structures may allow the bonder spacer flags 138a to have radial compliance, thereby allowing the bonder spacer flags 138a to move in a radial direction with the wafers 20, 30 as the wafers experience thermal expansion. Other mechanical and electromechanical devices beyond pneumatically-controlled devices may also be used to move the bonder spacer flag 138a.

Conventional bonding devices have used one or more pins to compress wafers, but these devices offer limited force control over the pin. In one example, a conventional pin had a single force that was created by a compression spring or similar device that could only apply constant pressure to the wafers. As a result, when the top and bottom chucks compressed the wafers, the area of the wafers that aligned with the pin had less pressure applied to it than the areas of the wafer contacted by the chucks, which caused a mechanical high yield loss at the portion of the wafer in contact with the pin. At the same time, the lower thermal conductivity of the conventional pin caused a thermal high yield loss at the portion of the wafer aligned with the pin. When these problems are combined with the fact that conventional pins have larger diameters and a large surround gap, commonly around 12 mm-14 mm, mechanical and thermal high yield loss adds up to be a significant inefficiency in wafer bonding.

Figure 18A:
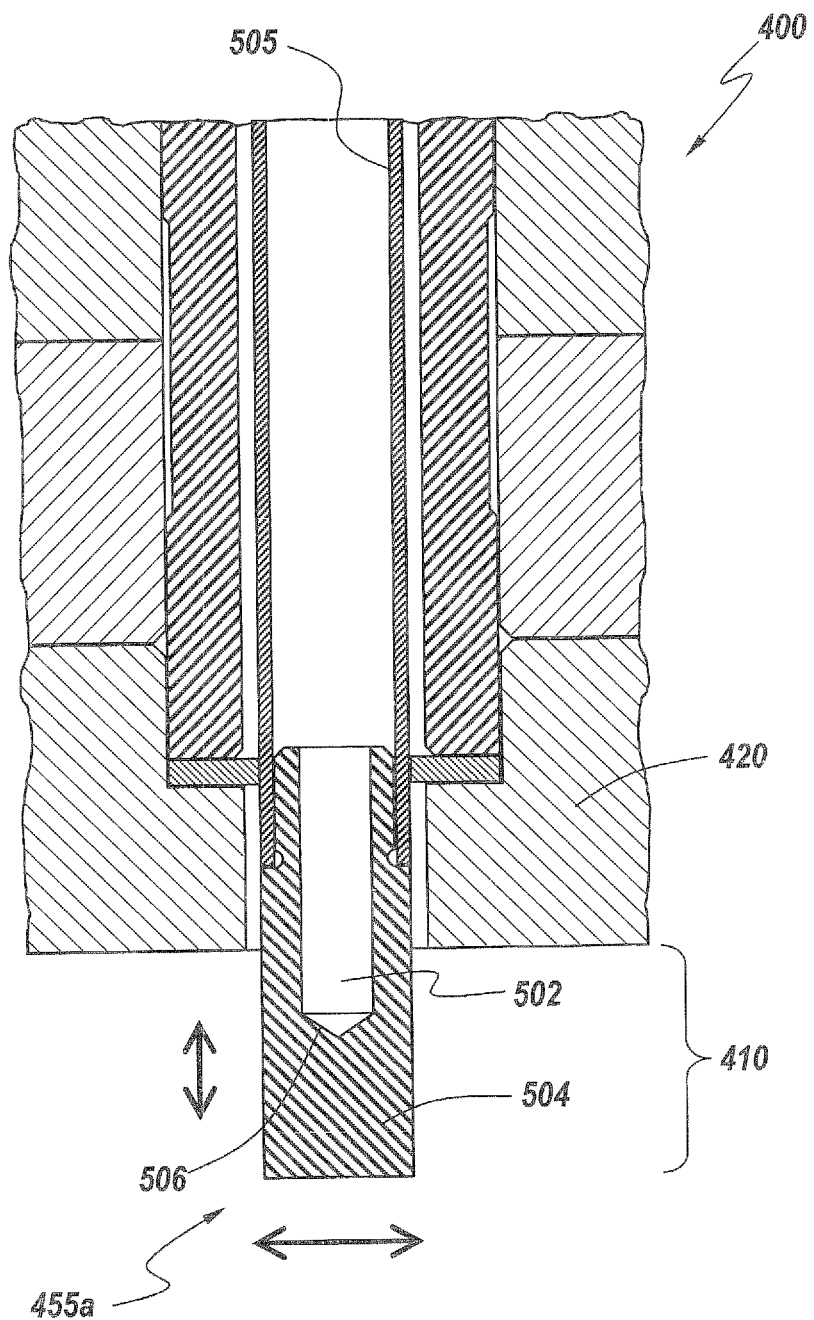
FIGS. 18A-18B are schematic diagrams of one example of a pin, in accordance with the first exemplary embodiment of this disclosure.
Figure 18B:
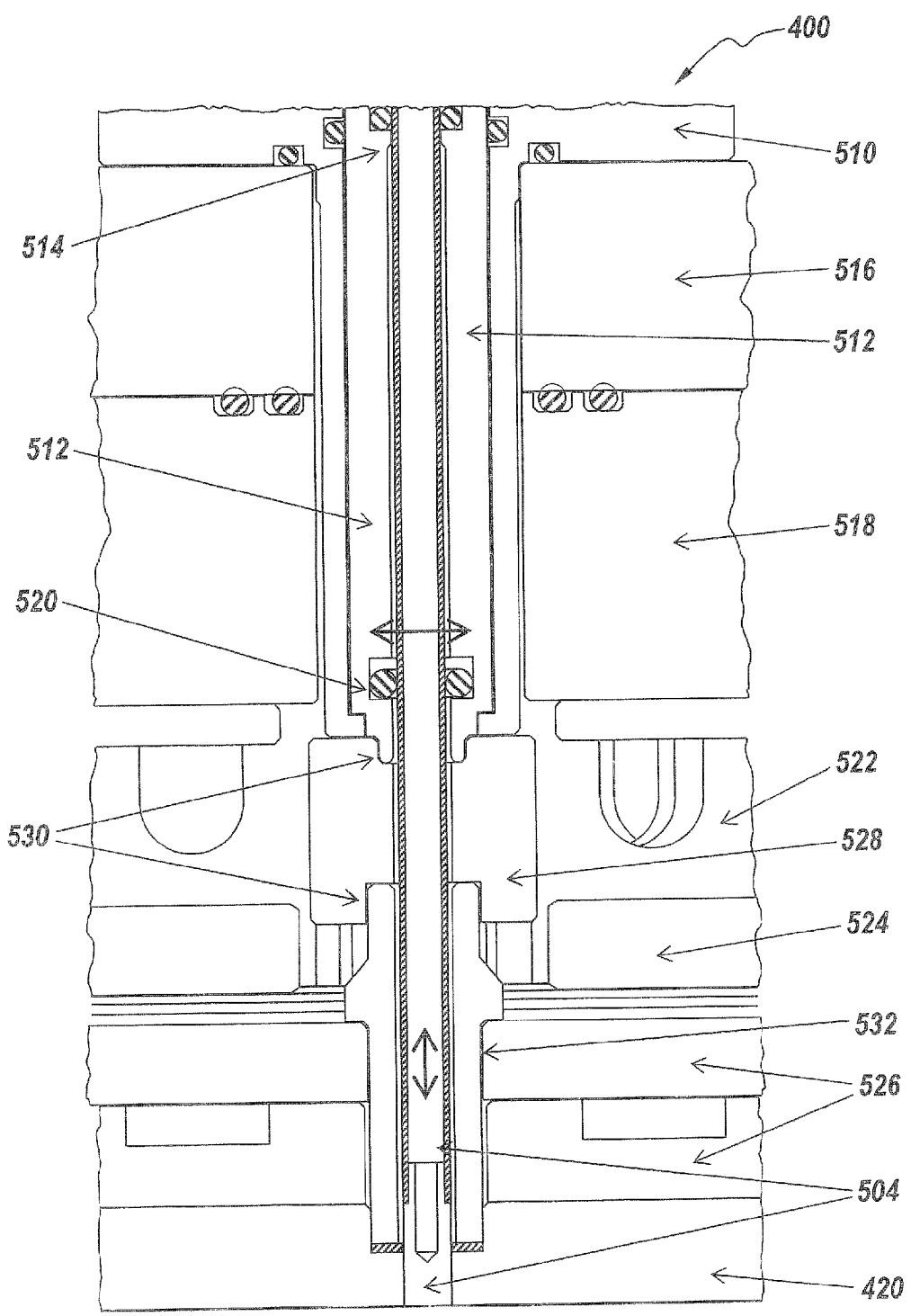

To overcome these problems, the subject disclosure contemplates a pin 455a that decreases both the mechanical yield loss and the thermal yield loss. To this end, FIGS. 18A-18B are schematic diagrams of one example of a pin 455a, in accordance with the first exemplary embodiment of this disclosure. As shown, the pin 455a may extend through the top chuck 420 of the bonding device such that it can be movable into the bonder chamber 410 area where the wafers (not shown) would be positioned for bonding. In one example, the pin 455a may be 5 mm in diameter and positioned within a 6 mm bore within the top chuck 420 to give the pin 455a approximately 0.50 mm of clearance to the top chuck 420. In comparison to prior art pins having a pin and gap diameter of roughly 12 mm-14 mm, the pin 455a having a 6 mm diameter with gap may greatly improve the mechanical high yield loss. Additionally, unlike conventional pins which use a compression spring to provide the mechanical force, the pin 455a may use a pneumatic actuator to control the force of the pin 455a on the wafers. As a result, the pressure exerted by the pin 455a may be selected to substantially match the pressure force of the chucks, thereby further decreasing the mechanical yield loss.

The pin 455a may be constructed from titanium, ceramics such as silicon nitride ceramics, or other materials, and may include a center pin 502 which is surrounded by a lower tube or sleeve 504 positioned along a bottom portion of the pin 455a, and an upper tube or sleeve 505 having a thin wall and positioned along an upper portion of the pin 455a. The lower sleeve 504 and the upper sleeve 505 may be connected together at a joint proximate to the center pin 502, such as with welding or another technique. The center pin 502 may include a pin tip 506 that is flat. The upper sleeve 505 may be actively heated by the surrounding chuck 420 and/or a heater pin 532 in abutment with a heater 526 positioned above the chuck 420, as is further described relative to FIG. 18B, and the center pin 502 may also be heated by the surrounding chuck 420. Additionally, it is possible to heat components of the pin 455a with a resistive heating element interfaced with the structures of the pin 455a. In some designs, both passive heating from the chuck 420 and active heating from a resistive element heating may be used to heat the various components of the pin 455a.

The pin 455a may be radially compliant near the tip, such that it is preloaded to center at +/−0.5 mm with top center locating to allow the pin tip 506. Preloading the pin 455a allows the pin 455a to have a natural, centered position when actuated but also allows the pin 455a to be radially compliant once under force. As a result, the pin 455a can maintain an application of normal force on the wafers.

Additional mechanics of the pin 455a are shown in detail in FIG. 18B. The pin 455a is positioned substantially centered within a center housing 510 having a center pin bushing 512, also known as a peek bushing, which itself has a bushing fit with a short length-to-diameter ratio 514, which is used for locating the pin 455a. The center pin bushing 512 provides electrical isolation of the pin 455a from the surrounding mechanics of the bonder 400, which is important for anodic bonding processes where significantly high voltages may be used to bond the wafers. The chamber lid 516 and a steel force reaction plate 518 are also positioned surrounding the center pin bushing 512. Towards a lower end of the center pin bushing 512 is a low force pre-load to center radial compliant O-ring 520, which may be manufactured from silicone or similar materials. The O-ring 520 allows the center pin 502 and surrounding tube 504 to move radially within the bonder 400. An aluminum cooling flange 522 is positioned below the force reaction plate 518, and a thermal isolation member 524 is positioned below the cooling flange 522 to thermally isolate the heater 526.

Internal of the cooling flange 522 is a bushing 528 which surrounds a portion of the center pin 502. The bushing 528 and the thermal isolation member 524 may be constructed from lithium aluminosilicate glass-ceramic, such as one sold under the tradename ZERODUR®, or a similar material. The bushing 528 may have inset cavities 530 on either side which act as overlap features to provide electrical isolation with low air dielectric in a vacuum. Positioned below the bushing 528 and around the lower edge of the center pin 502 and tube 504 is a heater pin 532. The heater pin 532 may be formed from silicon nitride and may be engaged with the lower inset cavity 530 of the bushing 528. The heater pin 532 may also interface the center pin 502 and tube 504 along the thickness of the heater 526 and at least a portion of the upper chuck 420. The positioning of the heater pin 532 in abutment with the heater 526, as well as the material used to construct the heater pin 532, may allow for efficient thermal transfers from the heater 526 through the heater pin 532 and to the center pin 502 and tube 504. This can allow the center pin 502 and tube 504 to have a temperature that substantially matches the temperature of the top chuck 420, since all structures are positioned to adequately transfer the heat from the heater 526 to the portions of the wafers they contact. Accordingly, the thermal yield loss that conventional pins experience may be improved significantly. Increasing the thermal connectivity of the pin 455a while being able to control a force of application of the pin 455a can improve the bonding of the wafers over that previously attained by the prior art.

FIG. 19 is a flowchart 600 illustrating a method of placing aligned wafers into a bonding device, in accordance with the first exemplary embodiment of the disclosure. It should be noted that any process descriptions or blocks in flow charts should be understood as representing modules, segments, portions of code, or steps that include one or more instructions for implementing specific logical functions in the process, and alternate implementations are included within the scope of the present disclosure in which functions may be executed out of order from that shown or discussed, including substantially concurrently or in reverse order, depending on the functionality involved, as would be understood by those reasonably skilled in the art of the present disclosure.

As is shown by block 602, wafers are secured in spaced alignment with an end effector having a frame member and a floating carrier movably connected to the frame member. A robot is used to move the end effector, thereby moving the wafers into a bonding chamber of a bonder (block 604). The wafers are unloaded from the end effector (block 606). The end effector is removed from the bonding chamber (block 608). The wafers are bonded (block 610). The method may further include any of the steps, processes, or functions disclosed relative to any figure of this disclosure.

It should be emphasized that the above-described embodiments of the present disclosure, particularly, any "preferred" embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A method of placing aligned wafers into a bonding device, the method comprising:

securing wafers in spaced alignment with an end effector having a frame member and a floating carrier movably connected to the frame member;

using a robot to move the end effector, thereby moving the wafers into a bonding chamber of a bonder;

unloading the wafers from the end effector;

removing the end effector from the bonding chamber; and bonding the wafers.

2. The method of claim 1, wherein the wafers are secured in spaced alignment using a plurality of clamp-spacer assemblies connected to at least one of the frame member and floating carrier.

3. The method of claim 2, wherein the plurality of clamp-spacer assemblies are spaced substantially equidistantly on a semi-circular interior perimeter of the floating carrier.

4. The method of claim 1, wherein unloading the wafers from the end effector further comprises decoupling the floating carrier from the frame member.

5. The method of claim 1, wherein unloading the wafers from the end effector further comprises:

inserting at least one bonder spacer flag between the wafers; and removing at least one end effector spacer flag from between the wafers.

6. The method of claim 1, wherein securing wafers in spaced alignment with the end effector further comprises retaining the wafers with a plurality of vacuum pads connected to the floating carrier, wherein each of the plurality of vacuum pads extend inward of a semi-circular interior perimeter of the floating carrier.

7. The method of claim 6, further comprising adjusting a position of the plurality of vacuum pads on the floating carrier radially along the semi-circular interior perimeter.

8. The method of claim 6, further comprising adjusting the floating carrier relative to the frame member along an axis of the semi-circular interior perimeter, wherein a size of a gap between the floating carrier and the frame member is adjustable.

9. The method of claim 1, further comprising centering the floating carrier to the frame member with a centering mechanism removably engagable between the frame member and the floating carrier, wherein the centering mechanism prevents a position change of the floating carrier relative to the frame member.

10. The method of claim 1, wherein unloading the wafers from the end effector further comprises:

contacting a chuck of the bonder to at least one of the wafers;

applying a compression force to the wafers with a compression pin;

inserting at least one bonder spacer flag between the wafers;

removing an end effector clamp from the wafers; and removing an end effector spacer flag from between the wafers.

11. The method of claim 10, wherein applying the compression force to the wafers with the compression pin further comprises matching a compression pressure between upper and lower chucks of the bonder.

12. The method of claim 10, wherein the compression pin further comprises at least two compression pins.

13. The method of claim 10, further comprising substantially matching a temperature of the compression pin with a temperature of the upper chuck of the bonder.

14. The method of claim 1, wherein bonding the wafers further comprises bonding the wafers in spaced alignment without contact of the wafers with the end effector during a bonding process.

15. A method for placing aligned wafer pairs into a processing device, the method comprising:

carrying wafers in spaced alignment with an end effector having a frame member and a floating carrier, wherein the floating carrier is movably connected to the frame member;

changing a location of the end effector with a robotic arm connected to the end effector; and placing the wafers in spaced alignment into a processing chamber of a processing device by decoupling the floating carrier from the frame member while the frame member and floating carrier are positioned within the processing chamber.

16. The method of claim 15, wherein placing into the processing chamber further comprises:

contacting a chuck of the processing device with at least one of the wafers;

applying a compression force to the wafers with a compression pin;

inserting at least one bonder spacer flag between the wafers;

removing an end effector clamp from the wafers; and removing an end effector spacer flag from between the wafers.

17. The method of claim 15, wherein applying the compression force to the wafers with the compression pin further comprises matching a compression pressure between upper and lower chucks of the processing device.

18. The method of claim 15, further comprising substantially matching a temperature of the compression pin with a temperature of the upper chuck of the bonder.

19. The method of claim 15, wherein applying the compression force to the wafers with the compression pin further comprises applying pressure with at least two compression pins, wherein at least one of the at least two compression pins applies a pressure at a substantial center point of the wafers and at least one of the at least two compression pins applies a pressure offset from the substantial center point of the wafers.

20. A method of transporting aligned wafers with an end effector, the method comprising:

holding at least two aligned wafers with a plurality of vacuum pads connected to a floating carrier of the end effector, wherein the floating carrier is connected to a frame member with a gap formed therebetween, and wherein the floating carrier has a semi-circular interior perimeter with each of the plurality of vacuum pads extending inward of the semi-circular interior perimeter of the floating carrier; and moving the end effector with a robotic arm.

* * * * *